United States Patent
Yamada et al.

(10) Patent No.: US 10,109,461 B2
(45) Date of Patent: Oct. 23, 2018

(54) PLASMA PROCESSING METHOD

(71) Applicants: Tokyo Electron Limited, Tokyo (JP); Daihen Corporation, Osaka-shi, Osaka (JP)

(72) Inventors: Norikazu Yamada, Miyagi (JP); Toshifumi Tachikawa, Miyagi (JP); Koichi Nagami, Miyagi (JP); Satoru Hamaishi, Osaka (JP); Koji Itadani, Osaka (JP)

(73) Assignees: TOKYO ELECTRON LIMITED, Tokyo (JP); DAIHEN CORPORATION, Osaki-Shi, Osaka (JP)

(*) Notice: Subject to any disclaimer, the term of this patent is extended or adjusted under 35 U.S.C. 154(b) by 0 days.

(21) Appl. No.: 15/642,469

(22) Filed: Jul. 6, 2017

(65) Prior Publication Data
US 2017/0372873 A1 Dec. 28, 2017

Related U.S. Application Data

(62) Division of application No. 14/365,334, filed as application No. PCT/JP2012/007798 on Dec. 5, 2012, now Pat. No. 9,734,992.

(30) Foreign Application Priority Data

Dec. 15, 2011 (JP) .................................. 2011-274391

(51) Int. Cl.
*H01L 21/00* (2006.01)
*H01J 37/32* (2006.01)
*H05H 1/46* (2006.01)

(52) U.S. Cl.
CPC .. *H01J 37/32183* (2013.01); *H01J 37/32091* (2013.01); *H01J 37/32146* (2013.01);
(Continued)

(58) Field of Classification Search
CPC .. H01J 2237/24495; H01J 2237/24564; H05H 2001/4682
See application file for complete search history.

(56) References Cited

U.S. PATENT DOCUMENTS 5,689,215 A * 11/1997 Richardson ....... H01J 37/32082
333/17.3
5,793,162 A * 8/1998 Barnes .............. H01J 37/32082
315/111.21
(Continued)

FOREIGN PATENT DOCUMENTS

| JP | 2009-033080 A | 2/2009 |
| JP | 2009-071292 A | 4/2009 |
| JP | 2009-246091 A | 10/2009 |
| JP | 2010-238881 A | 10/2010 |

OTHER PUBLICATIONS

International Search Report issued in Application No. PCT/JP2012/007798 dated Mar. 5, 2013.

*Primary Examiner* — Parviz Hassanzadeh
*Assistant Examiner* — Michelle Crowell
(74) *Attorney, Agent, or Firm* — Pearne & Gordon LLP

(57) ABSTRACT

A plasma processing method for performing a plasma process on a substrate in a plasma processing apparatus is provided. The plasma processing method comprises: a sampling-average-value calculating process of sampling voltage detection signals and electric current detection signals and calculating an average value of these signals during a first monitoring time; a moving-average-value calculating process of calculating a moving average value of the voltage detection signals and the electric current detection signals; a load impedance-measurement-value calculating process of
(Continued)

calculating a measurement value of a load impedance with respect to a first high frequency power supply; and a reactance control process of controlling a reactance of a variable reactance element such that the measurement value of the load impedance is equal or approximate to a preset matching point corresponding to impedance on the side of the first high frequency power supply.

12 Claims, 14 Drawing Sheets

Related U.S. Application Data

(60) Provisional application No. 61/585,755, filed on Jan. 12, 2012.

(52) U.S. Cl.
CPC ......... *H01J 37/32165* (2013.01); *H05H 1/46* (2013.01); *H01J 2237/24495* (2013.01); *H01J 2237/24564* (2013.01); *H01J 2237/334* (2013.01); *H05H 2001/4682* (2013.01)

(56) References Cited

U.S. PATENT DOCUMENTS

| | | | |
|---|---|---|---|
| 7,630,064 | B2 | 12/2009 | Tanaka |
| 8,018,164 | B2 * | 9/2011 | Shannon ........... H01J 37/32082 |
| | | | 156/345.2 |
| 9,640,368 | B2 * | 5/2017 | Umehara ................. H05H 1/46 |
| 2004/0116080 | A1 | 6/2004 | Chen |
| 2005/0093459 | A1 * | 5/2005 | Kishinevsky ..... H01J 37/32082 |
| | | | 315/111.21 |
| 2006/0220574 | A1 | 10/2006 | Ogawa |
| 2007/0262723 | A1 | 11/2007 | Ikenouchi |
| 2009/0255800 | A1 | 10/2009 | Koshimizu |
| 2009/0284156 | A1 | 11/2009 | Banna |
| 2010/0136793 | A1 | 6/2010 | Chen |
| 2010/0213162 | A1 | 8/2010 | Mochiki |
| 2010/0227420 | A1 | 9/2010 | Banna |
| 2011/0209827 | A1 | 9/2011 | Ashida |
| 2011/0214811 | A1 | 9/2011 | Ashida |
| 2013/0214683 | A1 * | 8/2013 | Valcore, Jr. ........ H01J 37/32082 |
| | | | 315/111.21 |
| 2015/0096684 | A1 | 4/2015 | Nagami |
| 2015/0122420 | A1 | 5/2015 | Konno |

* cited by examiner

MODULATION PARTS OF PULSE FREQUENCY $f_{RF2}$ (HIGH FREQUENCY POWER (RF2))

MODULATION PARTS OF PULSE FREQUENCY

MODULATION PARTS OF PULSE FREQUENCY $f_{RF2}$ (FUNDAMENTAL FREQUENCY REFLECTION WAVE)

MODULATION PARTS OF PULSE FREQUENCY

PLASMA PROCESSING METHOD

CROSS-REFERENCE TO RELATED APPLICATION

This is a divisional application of U.S. patent application Ser. No. 14/365,334, filed on Jun. 13, 2014, which is a U.S. national phase application under 35 U.S.C. § 371 of PCT Application No. PCT/JP2012/007798 filed on Dec. 5, 2012, which claims the benefit of Japanese Patent Application No. 2011-274391 filed on Dec. 15, 2011, and U.S. Provisional Application Ser. No. 61/585,755 filed on Jan. 12, 2012, the entire disclosures of which are incorporated herein by reference.

TECHNICAL FIELD

The embodiments described herein pertain generally to a technique of performing a plasma process on a processing target substrate, and particularly, to a plasma processing method in a capacitively coupled plasma processing apparatus in which a high frequency power to be supplied into a processing vessel is modulated in a pulse shape.

BACKGROUND

A capacitively coupled plasma processing apparatus includes an upper electrode and a lower electrode arranged in parallel to each other within a processing vessel. A processing target substrate (e.g., a semiconductor wafer, a glass substrate, etc) is mounted on the lower electrode, and a high frequency power having a frequency (typically, about 13.56 MHz or higher) suitable for plasma generation is applied to the upper electrode or the lower electrode. Electrons are accelerated by a high frequency field generated between the two facing electrodes by applying the high frequency power, and plasma is generated as a result of ionization by collision between the electrons and a processing gas. Through a gas phase reaction or a surface reaction of radicals or ions included in the plasma, a thin film is formed on the substrate, or a material or a thin film on a surface of the substrate is etched.

Recently, as a design rule is getting more miniaturized in a manufacturing process of a semiconductor device or the like, higher level of dimensional accuracy is required in, especially, plasma etching. Further, it is required to increase etching selectivity against a mask or an underlying film and to improve etching uniformity in the entire surface of a substrate. For this reason, pressure and ion energy in a processing region within a chamber tends to be reduced, and a high frequency power having a high frequency equal to or higher than about 40 MHz is used.

However, as the pressure and the ion energy are reduced, an influence of a charging damage, which has been negligible conventionally, can be no more neglected. That is, in a conventional plasma processing apparatus having high ion energy, no serious problem may occur even when a plasma potential is non-uniform in the entire surface of the substrate. However, if the ion energy is lowered at a lower pressure, the non-uniformity of the plasma potential in the entire surface of the substrate may easily cause the charging damage on a gate oxide film.

In this regard, a method of modulating power of a high frequency power used for plasma generation to an on/off (or H level/L level) pulse having a controllable duty ratio (hereinafter, referred to as "first power modulation process") has been considered effective (Patent Document 1). According to this power modulation process, a plasma generation state in which plasma of a processing gas is being generated and a plasma non-generation state in which plasma is not being generated are alternately repeated at a preset cycle during a plasma etching process. Accordingly, as compared to a typical plasma process in which plasma is continuously generated from the beginning of the process to the end thereof, a time period during which plasma is continuously generated may be shortened. Accordingly, the amount of electric charges introduced into a processing target substrate from the plasma at one time or the amount of electric charges accumulated on the surface of the processing target substrate may be reduced, so that the charging damage is suppressed from being generated. Therefore, a stable plasma process can be performed and reliability of the plasma process can be improved.

Further, conventionally, in the capacitively coupled plasma processing apparatus, a RF bias method is widely employed. In this RF bias method, a high frequency power having a relatively low frequency (typically, about 13.56 MHz or lower) is applied to the lower electrode on which the substrate is mounted, and ions in the plasma are accelerated and attracted to the substrate by a negative bias voltage or a sheath voltage generated on the lower electrode. In this way, by accelerating the ions in the plasma and bringing them into collision with the surface of the substrate, a surface reaction, anisotropic etching or modification of a film may be facilitated.

However, when performing the etching process to form via holes or contact holes by using the capacitively coupled plasma etching apparatus, a so-called micro-loading effect may occur. That is, an etching rate may differ depending on the hole size, so that it is difficult to control an etching depth. Especially, the etching rate tends to be higher at a large area such as a guide ring (GR), whereas the etching rate tends to be lower at a small via in which CF-based radicals are difficult to be introduced.

In this regard, a method of modulating power of a high frequency power used for ion attraction to a first level/second level (or on/off) pulse having a controllable duty ratio (hereinafter, referred to as "second power modulation process") has been considered effective. According to the second power modulation process, a period of maintaining a relatively high power of the first level (H level) suitable for etching a preset film on the processing target substrate and a period of maintaining a relatively low power of the second level (L level) as a high frequency power for ion attraction suitable for depositing polymer on a preset film on the processing target substrate are alternately repeated at a certain cycle. Accordingly, at an area having a larger hole size, a proper polymer layer may be deposited on the preset film at a higher deposition rate, so that the etching may be suppressed. Thus, an undesirable micro-loading effect may be reduced, and it may be possible to perform an etching process with a high selectivity and a high etching rate.

REFERENCES

Patent Document 1: Japanese Patent Laid-open Publication No. 2009-071292

Patent Document 2: Japanese Patent Laid-open Publication No. 2009-033080

Patent Document 3: Japanese Patent Laid-open Publication No. 2010-238881

DISCLOSURE OF THE INVENTION

Problems to be Solved by the Invention

In the first power modulation process or the second power modulation process as described above, a matching operation of a matching device provided in a high frequency transmission line for transmitting a high frequency power to plasma within a processing vessel from a high frequency power supply is considered as a problem to be solved. That is, the matching device is operated such that load impedance including a matching circuit is matched with impedance on the side of a high frequency power supply in order to most efficiently transmit the high frequency power outputted from the high frequency power supply to the plasma within the processing vessel. However, if the high frequency power is modulated in a pulse shape by the first power modulation process or the second power modulation process as described above, impedance of a plasma load is synchronized with a pulse and thus regularly changed, so that it becomes difficult to make the matching operation following this change.

In particular, it is cumbersome that a reflection wave reversely returning from the plasma back to the high frequency power supply through the high frequency transmission line includes not only a fundamental frequency reflection wave corresponding to the high frequency power but also a different frequency reflection wave such as distortion of a harmonic wave or a modulated wave according to a frequency of the power modulation. An object is to carry out a matching operation at a high speed with accuracy to reduce a power of the fundamental frequency reflection wave as low as possible by responding only to the fundamental frequency reflection wave without being affected by this different frequency reflection wave.

In this regard, conventionally, during a single cycle of power modulation, a matching operation is stopped for a time period during which a high frequency power on which the power modulation is performed is off (or at L level), and the matching operation is carried out for a time period during which the high frequency power is on (or at H level) (Patent Document 2). However, in each cycle of power modulation, a plasma status is greatly changed at the time of starting or right before ending an on (or H level) period. If a matching operation is carried out following the change in the plasma transient state, a reactance element (for example, a capacitor) within a matching device is operated slightly and repeatedly. As a result, stabilization of plasma is securely made and a plasma process becomes unstable, and also, a life of the reactance element is shortened. To solve this problem, in each cycle of power modulation, during an on-period (or H level) as well as during an off-period (or L level), the matching operation is controlled not to be performed for a certain period of time (transient time) after the on-period is started (Patent Document 3).

However, in recent years, even if any one of the first and second power modulation processes is used, in order to improve or increase a technical effect based on the power modulation process and process performance, or in order to increase a process margin, a plasma processing apparatus is required to have a wider range (for example, 10% to 90%) of a duty ratio than a conventional range (25% to 80%) and also required to have a higher range (for example, 100 Hz to 100 kHz) of a pulse frequency of the power modulation than a conventional range (0.25 Hz to 100 Hz). Therefore, for example, conditions including a duty ratio of 10% and a pulse frequency for power modulation of 90 kHz may be selected. According to the conventional method in which the matching operation of the matching device is intermittently stopped in each cycle of power modulation, if a pulse frequency for power modulation is on the order of kHz or 10 kHz as such, it is not possible to follow a change in load (plasma) impedance, and malfunction or life-shortening of components of an operation system in the matching device may be caused. Therefore, it is difficult to be applicable for a power modulation process with a high pulse frequency.

Further, conventionally, with respect to a high frequency power on which the power modulation is not performed, any specific control has not been carried out to a matching device provided on the high frequency transmission line thereof. Therefore, the corresponding matching device is not synchronized with the power modulation performed on other high frequency powers, but carries out a typical matching operation of responding to a change in load (plasma) impedance every moment (continuously) in the same manner as a case where only the high frequency power on which the power modulation is not performed in the high frequency transmission line is applied to the plasma within the processing vessel. However, it has been difficult to stably and accurately establish a fully matched state or a semi-matched state through such a typical matching operation. Further, if the frequency of power modulation is on the order of kHz or 10 kHz as described above, a matching problem in the high frequency power on which power modulation is not performed becomes very conspicuous.

In view of the foregoing, example embodiments provide a capacitively coupled plasma processing apparatus capable of performing a stable and accurate matching operation with high reproducibility in the first or second power modulation process of modulating the high frequency power to be supplied into the processing vessel in the pulse shape.

Means for Solving the Problems

In a first example embodiment, there is provided a plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a first high frequency power supply configured to output a first high frequency power having a frequency suitable for ion attraction into the substrate on the first electrode from the plasma; a first high frequency transmission line configured to transmit the first high frequency power outputted from the first high frequency power supply to the first electrode; a first matching device configured to match impedance on the side of the first high frequency power supply with load impedance, the first matching device including a variable reactance element; a second high frequency power supply configured to output a second high frequency power having a frequency suitable for plasma generation; a second high frequency transmission line configured to transmit the second high frequency power outputted from the second high frequency power supply to any one of the first electrode and the second electrode; a second matching device configured to match impedance on the side of the second high frequency power supply with load impedance on the second high frequency transmission line; and a high frequency power modulation unit configured to control the second high frequency power supply such that a first period during which the second high frequency power is on or has a first level and a second period during which the second high frequency power is off or has a second level lower than the first level is alternately repeated at a predetermined pulse frequency. The plasma processing method includes: a sampling-average-value calculating process of sampling voltage detection signals and electric current detection signals corresponding to the first high frequency power on the first high frequency supply line with a preset sampling frequency and calculating an average value of these signals during a first monitoring time set for both of the first period and the second period in each cycle of the pulse frequency; a moving-average-value calculating process of calculating a moving average value of the voltage detection signals and the electric current detection signals at a cycle of a sampling clock having a frequency of 1/m times of the pulse frequency (m is an integer of 2 or more) based on an average value obtained from the sampling-average-value calculating process in each cycle; a load impedance-measurement-value calculating process of calculating a measurement value of the load impedance with respect to the first high frequency power supply based on the moving average value of the voltage detection signals and the electric current detection signals obtained from the moving-average-value calculating process; and a reactance control process of controlling a reactance of the variable reactance element such that the measurement value of the load impedance obtained from the load impedance-measurement-value calculating process is equal or approximate to a preset matching point corresponding to impedance on the side of the first high frequency power supply.

In a second example embodiment, there is provided a plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a first high frequency power supply configured to output a first high frequency power having a frequency suitable for ion attraction into the substrate on the first electrode from the plasma; a first high frequency transmission line configured to transmit the first high frequency power outputted from the first high frequency power supply to the first electrode; a first matching device configured to match impedance on the side of the first high frequency power supply with load impedance on the first high frequency transmission line, the first matching device including a variable reactance element; a second high frequency power supply configured to output a second high frequency power having a frequency suitable for plasma generation; a second high frequency transmission line configured to transmit the second high frequency power outputted from the second high frequency power supply to any one of the first electrode and the second electrode; a second matching device configured to match impedance on the side of the second high frequency power supply with load impedance on the second high frequency transmission line; and a high frequency power modulation unit configured to control the second high frequency power supply such that a first period during which the second high frequency power is on or has a first level and a second period during which the second high frequency power is off or has a second level lower than the first level is alternately repeated at a predetermined pulse frequency. The plasma processing method includes: a sampling-average-value calculating process of sampling measurement values of the load impedance on the first high frequency transmission line with a preset sampling frequency and calculating an average value of the measurement values during a first monitoring time set for both of the first period and the second period in each cycle of the pulse frequency; a moving-average-value calculating process of calculating a moving average value of the measurement values of the load impedance at a cycle of a sampling clock having a frequency of 1/m times of the pulse frequency (m is an integer of 2 or more) based on the average value obtained from the sampling-average-value calculation process in each cycle; and a reactance control process of controlling a reactance of the variable reactance element such that the moving average value of the measurement values of the load impedance obtained from the moving-average-value calculating process is equal or approximate to a preset matching point corresponding to impedance on the side of the first high frequency power supply.

In a third example embodiment, there is provided a plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a first high frequency power supply configured to output a first high frequency power having a frequency suitable for plasma generation; a first high frequency transmission line configured to transmit the first high frequency power outputted from the first high frequency power supply to the first electrode; a first matching device configured to match impedance on the side of the first high frequency power supply with load impedance, the first matching device including a variable reactance element; a second high frequency power supply configured to output a second high frequency power having a frequency suitable for ion attraction into the substrate on the first electrode from the plasma; a second high frequency transmission line configured to transmit the second high frequency power outputted from the second high frequency power supply to the first electrode; a second matching device configured to match impedance on the side of the second high frequency power supply with load impedance on the second high frequency transmission line; and a high frequency power modulation unit configured to control the second high frequency power supply such that a first period during which the second high frequency power is on or has a first level and a second period during which the second high frequency power is off or has a second level lower than the first level is alternately repeated at a predetermined pulse frequency. The plasma processing method includes: a sampling-average-value calculating process of sampling voltage detection signals and electric current detection signals corresponding to the first high frequency power on the first high frequency supply line with a preset sampling frequency and calculating an average value of these signals during a first monitoring time set for both of the first period and the second period in each cycle of the pulse frequency; a moving-average-value calculating process of calculating a moving average value of the voltage detection signals and the electric current detection signals at a cycle of a sampling clock having a frequency of 1/m times of the pulse frequency (m is an integer of 2 or more) based on an average value obtained from the sampling-average-value calculating process in each cycle; a load impedance-measurement-value calculating process of calculating a measurement value of the load impedance with respect to the first high frequency power supply based on the moving average value of the voltage detection signals and the electric current detection signals obtained from the moving-average-value calculating process; and a reactance control process of controlling a reactance of the variable reactance element such that the measurement value of the load impedance obtained from the load impedance-measurement-value calculating process is equal or approximate to a preset matching point corresponding to impedance on the side of the first high frequency power supply.

In a fourth example embodiment, there is provided a plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a first high frequency power supply configured to output a first high frequency power having a frequency suitable for plasma generation; a first high frequency transmission line configured to transmit the first high frequency power outputted from the first high frequency power supply to the first electrode; a first matching device configured to match impedance on the side of the first high frequency power supply with load impedance, the first matching device including a variable reactance element; a second high frequency power supply configured to output a second high frequency power having a frequency suitable for ion attraction into the substrate on the first electrode from the plasma; a second high frequency transmission line configured to transmit the second high frequency power outputted from the second high frequency power supply to the first electrode; a second matching device configured to match impedance on the side of the second high frequency power supply with load impedance on the second high frequency transmission line; and a high frequency power modulation unit configured to control the second high frequency power supply such that a first period during which the second high frequency power is on or has a first level and a second period during which the second high frequency power is off or has a second level lower than the first level is alternately repeated at a predetermined pulse frequency. The plasma processing method includes: a sampling-average-value calculating process of sampling measurement values of the load impedance on the first high frequency transmission line with a preset sampling frequency and calculating an average value of the measurement values during a first monitoring time set for both of the first period and the second period in each cycle of the pulse frequency; a moving-average-value calculating process of calculating a moving average value of the measurement values of the load impedance at a cycle of a sampling clock having a frequency of 1/m times of the pulse frequency (m is an integer of 2 or more) based on the average value obtained from the sampling-average-value calculation process in each cycle; and a reactance control process of controlling a reactance of the variable reactance element such that the moving average value of the measurement values of the load impedance obtained from the moving-average-value calculating process is equal or approximate to a preset matching point corresponding to impedance on the side of the first high frequency power supply.

In a fifth example embodiment, there is provided a plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a high frequency power supply configured to output a high frequency power for plasma generation; a high frequency transmission line configured to transmit the high frequency power outputted from the high frequency power supply to any one of the first electrode and the second electrode; a matching device configured to match impedance on the side of the high frequency power supply with load impedance on the high frequency transmission line, the matching device including a variable reactance element; a high frequency power modulation unit configured to control the high frequency power supply such that a first period during which the high frequency power is on and a second period during which the high frequency power is off is alternately repeated at a predetermined pulse frequency. The plasma processing method includes: a sampling-average-value calculating process of sampling voltage detection signals and electric current detection signals corresponding to the high frequency power on the high frequency supply line with a preset sampling frequency and calculating an average value of these signals during a monitoring time set for the first period in each cycle of the pulse frequency; a moving-average-value calculating process of calculating a moving average value of the voltage detection signals and the electric current detection signals at a cycle of a sampling clock having a frequency of 1/m times of the pulse frequency (m is an integer of 2 or more) based on the average value obtained from the sampling-average-value calculating process in each cycle; a load impedance-measurement-value calculating process of calculating a measurement value of the load impedance with respect to the high frequency power supply based on the moving average value of the voltage detection signals and the electric current detection signals obtained from the moving-average-value calculating process; and a reactance control process of controlling a reactance of the variable reactance element such that the measurement value of the load impedance obtained from the load impedance-measurement-value calculating process is equal or approximate to a preset matching point corresponding to impedance on the side of the high frequency power supply.

In a sixth example embodiment, plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a high frequency power supply configured to output a high frequency power for plasma generation; a high frequency transmission line configured to transmit the high frequency power outputted from the high frequency power supply to any one of the first electrode and the second electrode; a matching device configured to match impedance on the side of the high frequency power supply with load impedance on the high frequency transmission line, the matching device including a variable reactance element; a high frequency power modulation unit configured to control the high frequency power supply such that a first period during which the high frequency power is on and a second period during which the high frequency power is off is alternately repeated at a predetermined pulse frequency. The plasma processing method includes: a sampling-average-value calculating process of sampling measurement values of the load impedance on the high frequency transmission line with a preset sampling frequency and calculating an average value of the measurement values during a monitoring time set for the first period in each cycle of the pulse frequency; a moving-average-value calculating process of calculating a moving average value of the measurement values of the load impedance at a cycle of a sampling clock having a frequency of 1/m times of the pulse frequency (m is an integer of 2 or more) based on the average value obtained from the sampling-average-value calculation process in each cycle; and a reactance control process of controlling a reactance of the variable reactance element such that the moving average value of the measurement values of the load impedance obtained from the moving-average-value calculating process is equal or approximate to a preset matching point corresponding to impedance on the side of the high frequency power supply.

Effect of the Invention

In accordance with the example embodiments, with the above-described configuration and operation, a plasma processing apparatus can perform a stable and accurate matching operation with high reproducibility in a first modulation process or a second power modulation process of modulating of a high frequency power to be supplied into a processing vessel in a pulse shape.

MODE FOR CARRYING OUT THE INVENTION

Hereinafter, example embodiments will be explained with reference to the accompanying drawings.

<Configuration of Plasma Processing Apparatus>

Figure 1:
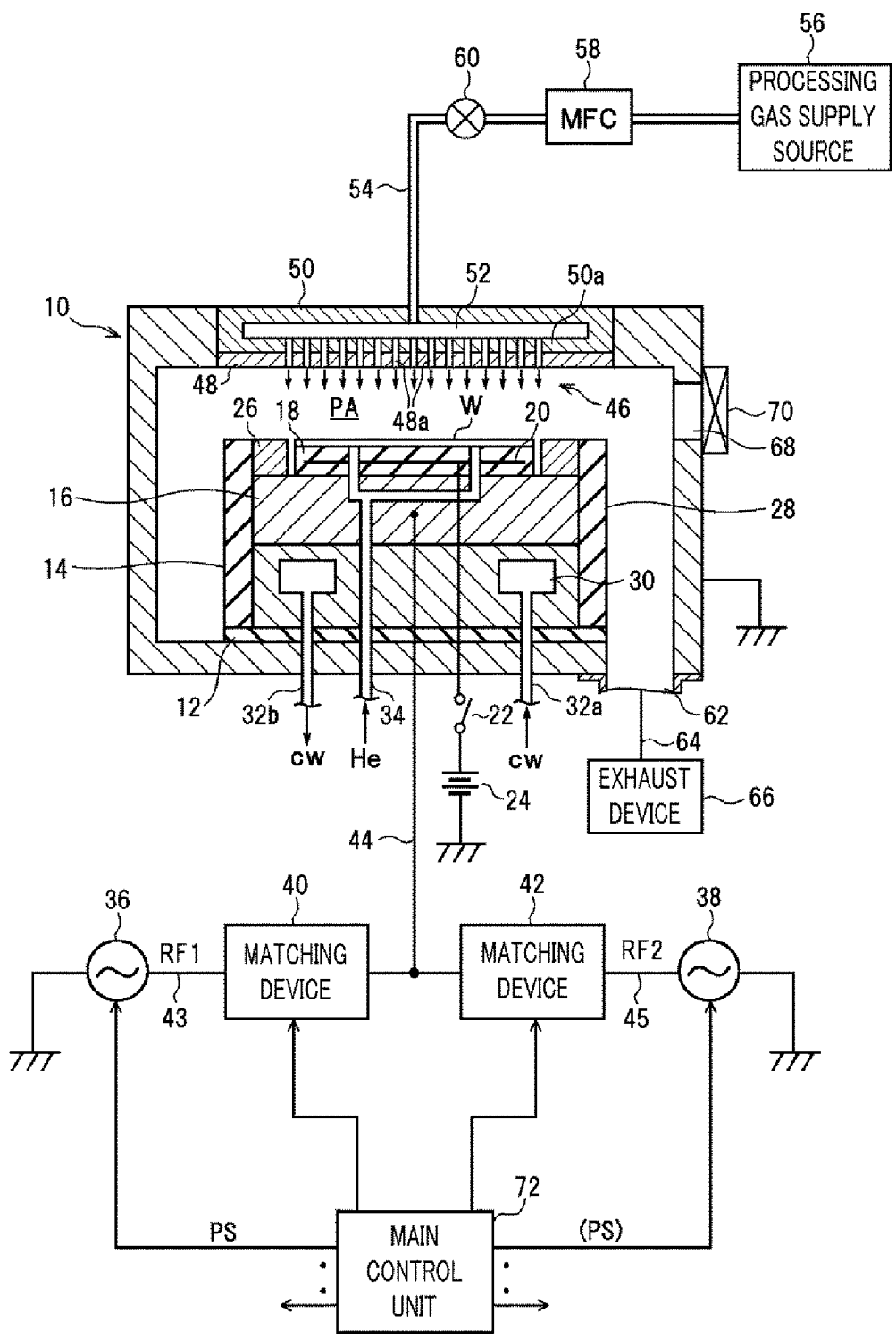
FIG. 1 is a cross-sectional view showing a configuration of a capacitively coupled plasma processing apparatus in accordance with an example embodiment.

FIG. 1 shows a configuration of a plasma processing apparatus in accordance with an example embodiment. This plasma processing apparatus is configured as a capacitively coupled (parallel plate type) plasma etching apparatus in which dual high frequency powers are applied to a lower electrode. By way of example, the plasma processing apparatus includes a cylindrical decompression chamber (processing vessel) 10 made of, but not limited to, aluminum having an alumite-treated (anodically oxidized) surface. The chamber 10 is grounded.

A circular columnar susceptor supporting member 14 is provided on an insulating plate 12 such as ceramic on a bottom of the chamber 10, and a susceptor 16 made of, but not limited to, aluminum is provided on the susceptor supporting member 14. The susceptor 16 serves as a lower electrode, and a processing target substrate, e.g., a semiconductor wafer W is mounted on the susceptor 16.

An electrostatic chuck 18 configured to hold the semiconductor wafer W is provided on a top surface of the susceptor 16. The electrostatic chuck 18 includes a pair of insulating layers or insulating sheets; and an electrode 20 embedded therebetween. The electrode 20 is made of a conductive film and is electrically connected with a DC power supply 24 via a switch 22. The semiconductor wafer W can be held on the electrostatic chuck 18 by an electrostatic adsorptive force generated by a DC voltage applied from the DC power supply 24. In order to improve etching uniformity, a focus ring 26 made of, but not limited to, silicon is provided on the top surface of the susceptor 16 to surround the electrostatic chuck 18. A cylindrical inner wall member 28 made of, but not limited to, quartz is attached to side surfaces of the susceptor 16 and the susceptor supporting member 14.

A coolant path 30 extended in, e.g., a circumferential direction is provided within the susceptor supporting member 14. A coolant of a preset temperature, e.g., cooling water from an external chiller unit (not shown) is supplied into and circulated through the coolant path 30 via pipelines 32a and 32b. A processing temperature of the semiconductor wafer W on the susceptor 16 can be controlled by adjusting the temperature of the coolant. Further, a heat transfer gas, e.g., a He gas from a heat transfer gas supplying device (not shown) is supplied into a gap between a top surface of the electrostatic chuck 18 and a rear surface of the semiconductor wafer W through a gas supply line 34.

The susceptor 16 is electrically connected with high frequency power supplies 36 and 38 via matching unit devices 40 and 42, respectively, and a common power supply conductor (for example, a power supply rod) 44. One high frequency power supply 36 outputs a high frequency power RF1 having a frequency $f_{RF1}$ (for example, 100 MHz) suitable for plasma generation. Meanwhile, the other high frequency power supply 38 outputs a high frequency power RF2 having a frequency $f_{RF2}$ (for example, 13.56 MHz) suitable for ion attraction to the semiconductor wafer W on the susceptor 16 from the plasma.

As such, the matching device 40 and the power supply rod 44 constitute a part of a high frequency transmission line (high frequency transmission path) 43 configured to transmit the high frequency power RF1 for plasma generation from the high frequency power supply 36 to the susceptor 16. Meanwhile, the matching device 42 and the power supply rod 44 constitute a part of a high frequency transmission line (high frequency transmission path) 45 configured to transmit the high frequency power RF2 for ion attraction from the high frequency power supply 38 to the susceptor 16.

An upper electrode 46 having a ground potential is provided at a ceiling of the chamber 10, facing the susceptor 16 in parallel. The upper electrode 46 includes an electrode plate 48 having a multiple number of gas discharge holes 48a and made of, e.g., a silicon-containing material such as Si or SiC; and an electrode supporting body 50 detachably supporting the electrode plate 48 and made of a conductive material such as aluminum having an alumite-treated surface. A plasma generation space or a processing space PA is formed between the upper electrode 46 and the susceptor 16.

The electrode supporting body 50 has a gas buffer room 52 formed therein. The electrode supporting body 50 also has, in its bottom surface, a multiple number of gas holes 50a extended from the gas buffer room 52, and the gas holes 50a communicate with the gas discharge holes 48a of the electrode plate 48, respectively. The gas buffer room 52 is connected to a processing gas supply source 56 via a gas supply line 54. The processing gas supply source 56 is provided with a mass flow controller (MFC) 58 and an opening/closing valve 60. If a certain processing gas (etching gas) is introduced into the gas buffer room 52 from the processing gas supply source 56, the processing gas is then discharged in a shower shape from the gas discharge holes 48a of the electrode plate 48 into the processing space PA toward the semiconductor wafer W on the susceptor 16. In this configuration, the upper electrode 46 also serves as a shower head that supplies the processing gas into the processing space PA.

Further, a passageway (not shown) in which a coolant, e.g., cooling water flows may be provided within the electrode supporting body 50. The entire upper electrode 46, especially, the electrode plate 48 is controlled to a preset temperature through the coolant by an external chiller unit. Further, in order to stabilize the temperature control over the upper electrode 46, a heater (not shown) including a resistance heating device may be provided within or on a top surface of the electrode supporting body 50.

An annular space formed between a sidewall of the chamber 10, and the susceptor 16 and the susceptor supporting member 14 serves as a gas exhaust space, and a gas exhaust opening 62 of the chamber 10 is formed in a bottom of this gas exhaust space. The gas exhaust opening 62 is connected to a gas exhaust device 66 via a gas exhaust line 64. The gas exhaust device 66 includes a vacuum pump such as a turbo molecular pump and is configured to depressurize the inside of the chamber 10, particularly, the processing space PA to a required vacuum level. Further, a gate valve 70 configured to open and close a loading/unloading opening 68 for the semiconductor wafer W is provided at the sidewall of the chamber 10.

A main controller 72 includes one or more microcomputers and is configured to control an overall operation (sequence) of the apparatus and individual operations of respective components within the apparatus, particularly, the high frequency power supplies 36 and 38, the matching devices 40 and 42, the MFC 58, the opening/closing valve 60, the gas exhaust device 66, etc., according to software (program) and recipes stored in an external memory or an internal memory.

Further, the main controller 72 is connected to a man-machine interface manipulation panel (not shown) including an input device such as a keyboard and a display device such as a liquid crystal display and, also, connected to an external storage device (not shown) that stores various types of data such as various programs or recipes, setting values, etc. In the present example embodiment, the main controller 72 is configured as a single control unit. However, it may be also possible to adopt a configuration in which multiple control units divide up the functions of the main controller 72 individually or hierarchically.

A basic operation of single-sheet typed dry etching in the capacitively coupled plasma etching apparatus configured as described above is performed as follows. First, the gate valve 70 is opened, and a semiconductor wafer W to be processed is loaded into the chamber 10 and mounted on the electrostatic chuck 18. Then, a processing gas, i.e., an etching gas (generally, a gaseous mixture) is introduced into the chamber 10 from the processing gas supply source 56 at a preset flow rate and a preset flow rate ratio, and the inside of the chamber 10 is evacuated to be a set vacuum pressure by the gas exhaust device 66. Further, the high frequency power RF1 (100 MHz) for plasma generation and the high frequency power RF2 (13.56 MHz) for ion attraction from the high frequency power supplies 36 and 38 are overlapped at preset powers, respectively, to be applied to the susceptor 16. Further, a DC voltage from the DC power supply 24 is applied to the electrode 20 of the electrostatic chuck 18, so that the semiconductor wafer W is held on the electrostatic chuck 18. The etching gas discharged from the upper electrode 46 serving as the shower head is discharged under a high frequency electric field between the two electrodes 46 and 16, so that plasma is generated in the processing space PA. An etching target film on a main surface of the semiconductor wafer W is etched by radicals or ions included in the plasma.

In this capacitively coupled plasma etching apparatus, for example, to solve the above-described charging damage, a first power modulation process of modulating the high frequency power RF1 for plasma generation outputted from the high frequency power supply 36 in an on/off (or H level/L level) pulse shape having a pulse frequency of, for example, 1 kHz to 100 kHz with a duty ratio within a range of, for example, 10% to 90% can be used for the etching process. Further, to solve the above-described micro-loading effect, a second power modulation process of modulating the high frequency power RF2 for ion attraction outputted from the high frequency power supply 38 in an on/off (or H level/L level) pulse shape having a pulse frequency of, for example, 100 Hz to 50 kHz with a duty ratio within a range of, for example, 10% to 90% can also be used for the etching process.

By way of example, if a dry etching process is carried out by the first power modulation process, a modulation control pulse signal PS that defines a pulse frequency $f_s$ and a duty ratio $D_s$ set for the power modulation is sent from the main control unit 72 to the high frequency power supply 36. The high frequency power supply 36 turns on/off the high frequency power RF1 for plasma generation in synchronization with the modulation control pulse signal PS. Herein, assuming that a cycle, the on-period (first period) and the off-period (second period) of the modulation control pulse signal PS are set to $T_C$, $T_{on}$, and $T_{off}$, respectively, relational expressions $T_C=1/f_S$, $T_C=T_{on}+T_{off}$, and $D_S=T_{on}/(T_{on}+T_{off})$ are established.

Meanwhile, in the first power modulation process, the high frequency power supply 38 does not turn on/off the high frequency power RF2 for ion attraction, but continuously outputs the high frequency power RF2 for ion attraction. In this case, due to on/off of the high frequency power RF1, impedance of plasma within the chamber 10 is changed between two values. Therefore, a matching operation or a matching degree on the high frequency transmission line 45 is also changed between two states in synchronization with on/off of the high frequency power RF1. To be more specific, as described below, between the on-period $T_{on}$ and the off-period $T_{off}$ constituting one cycle of the pulse frequency $f_s$, a matching degree is different depending on a duration thereof, and is closer to a fully matched state during a relatively long on-period as compared with a short on-period. Also, there is made a difference in a power of the high frequency power RF2 on the high frequency transmission line 45 accordingly.

Figure 2A:
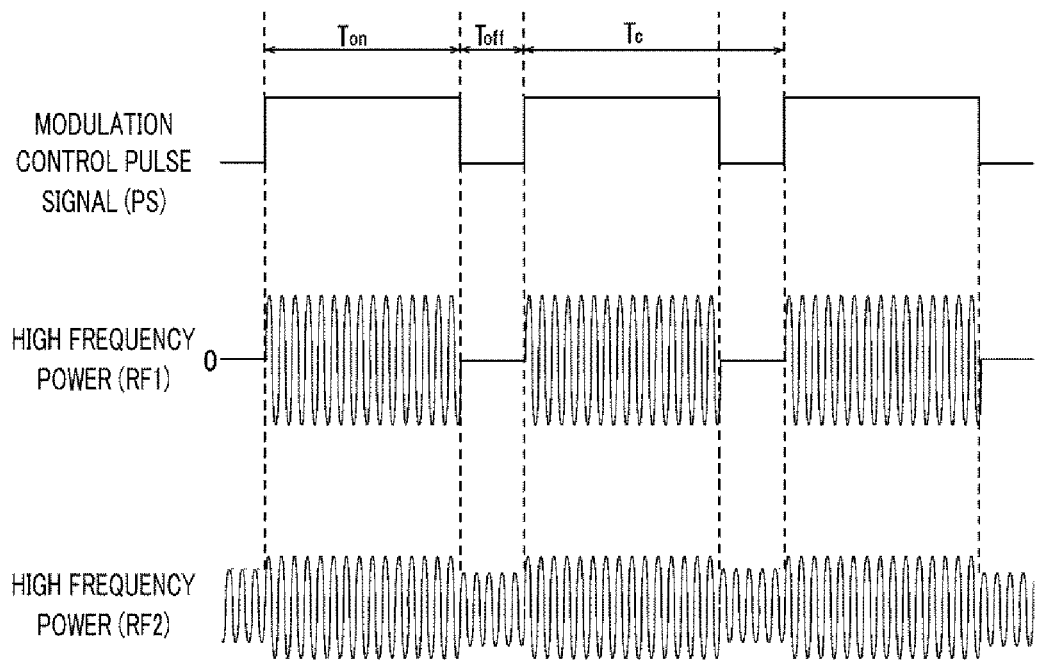
FIG. 2A is a waveform diagram of a high frequency power showing an example of a power modulation in the plasma processing apparatus.

That is, as depicted in FIG. 2A, if the on-period $T_{on}$ is sufficiently longer than the off-period $T_{off}$ (if the duty ratio $D_s$ is sufficiently high), the matching degree is closer to a fully matched state during the on-period $T_{on}$ than the off-period $T_{off}$, and, thus, the power of the high frequency power RF2 is higher during the on-period $T_{on}$ than the off-period $T_{off}$.

Figure 2B:
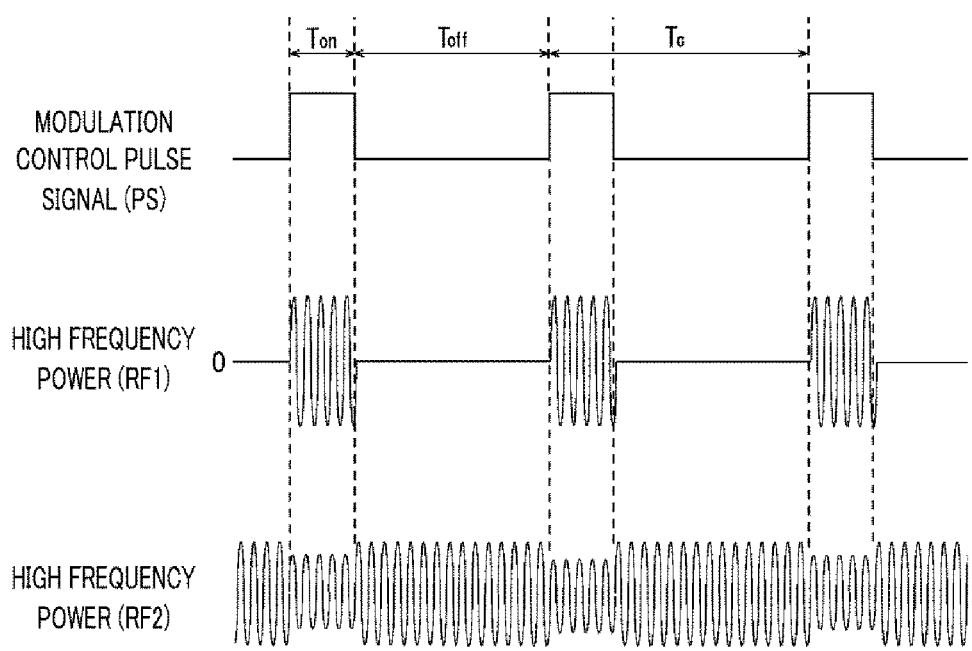
FIG. 2B is a waveform diagram of a high frequency power showing another example of the power modulation in the plasma processing apparatus.

On the contrary, as depicted in FIG. 2B, if the off-period $T_{off}$ is sufficiently longer than the on-period $T_{on}$ (if the duty ratio $D_s$ is sufficiently low), the matching degree is closer to a fully matched state during the off-period $T_{off}$ than the on-period $T_{on}$, and, thus, the power of the high frequency power RF2 is higher during the off-period $T_{off}$ than the on-period $T_{on}$.

Figure 3A:
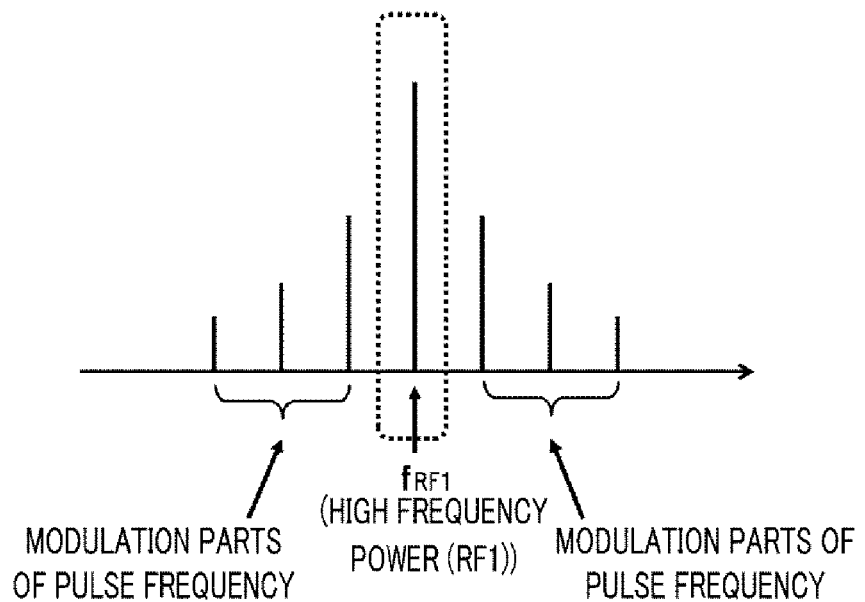
FIG. 3A shows spectra of a high frequency power on which the power modulation is performed and its side bands (modulation parts).
Figure 3B:
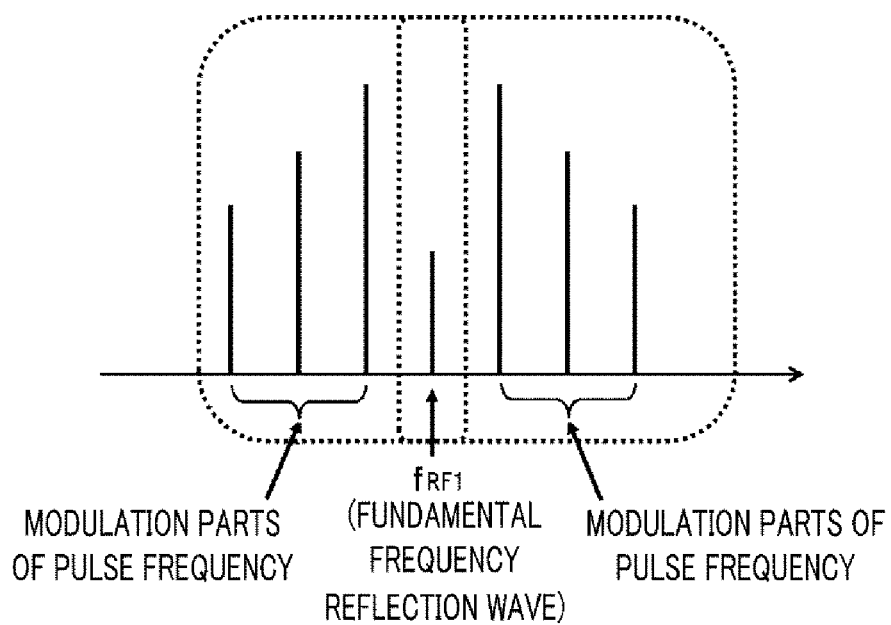
FIG. 3B shows spectra of a reflection wave in a case where a matching operation is performed.

If the power modulation is performed on the high frequency power RF1 for plasma generation by the first power modulation process as such, in a progressive wave heading toward the susceptor 16 within the chamber 10 from the high frequency power supply 36 on the high frequency transmission line 43, as depicted in FIG. 3A, there are included frequency components in side bands (modulation parts of the pulse frequency) caused by the pulse frequency $f_s$ around (at both sides of) the high frequency power RF1 on a frequency axis as well as the high frequency power RF1. In this case, when a matching operation of the matching device 40 is carried out well and the matching is done well, the high frequency power RF1 is most efficiently absorbed into the plasma. Therefore, in a reflection wave that propagates on the high frequency transmission line 43 in a backward direction from the plasma within the chamber 10, as depicted in FIG. 3B, a power of a fundamental frequency reflection wave having the same frequency $f_{RF1}$ as the high frequency power RF1 is remarkably decreased.

Figure 4A:
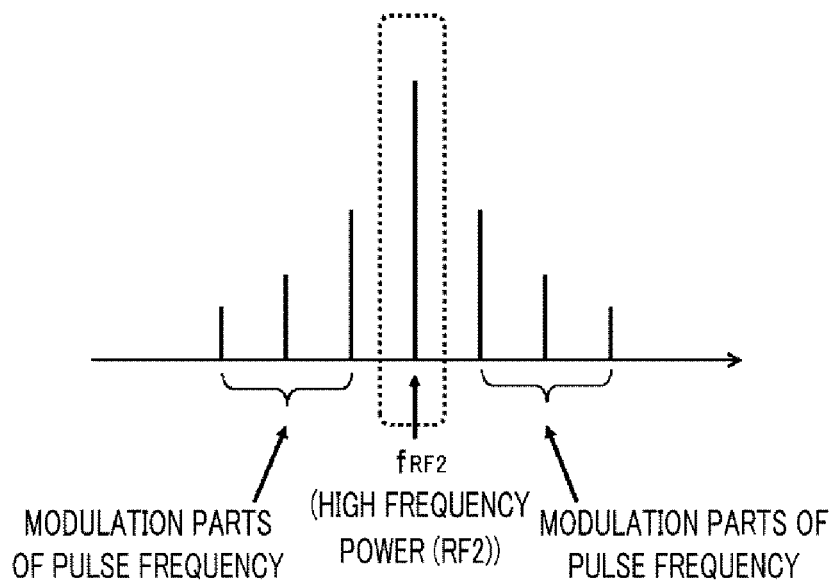
FIG. 4A shows spectra of a high frequency power on which the power modulation is not performed and its side bands (modulation parts).
Figure 4B:
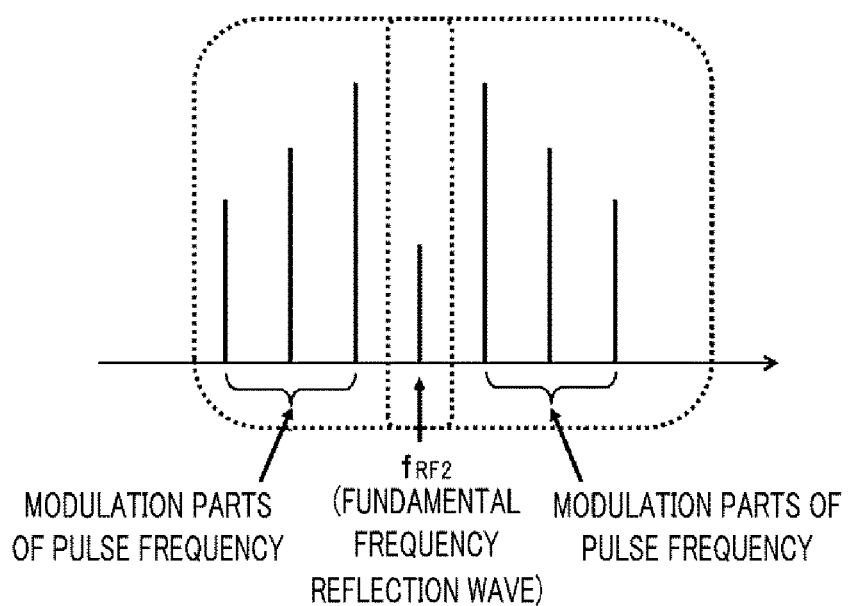
FIG. 4B shows spectra of a reflection wave in a case where a matching operation is performed.

Meanwhile, in a power supply system on the side of the high frequency power RF2 on which the power modulation is not performed, the high frequency power RF2 is (changed) between two values in synchronization with on/off of the high frequency power RF1 as described above, and, thus, as depicted in FIG. 4A, there are included frequency components in side bands (modulation parts of the pulse frequency) caused by the pulse frequency $f_s$ as well as the high frequency power RF2, and the fundamental frequency reflection wave in the progressive wave and the reflection wave. Therefore, when a matching operation of the matching device 42 is carried out well and the matching is done well, the high frequency power RF2 is most efficiently absorbed into the plasma. In this case, in a reflection wave that propagates on the high frequency transmission line 45 in a backward direction from the plasma within the chamber 10, as depicted in FIG. 4B, a power of a fundamental frequency reflection wave having the same frequency $f_{RF2}$ as the high frequency power RF2 is remarkably decreased.

Further, even if the power modulation is performed on the high frequency power RF2 for ion attraction by the second power modulation process, there are generated side bands accompanied with the same power modulation as described above just by replacing the high frequency power RF1 with the high frequency power RF2, and the same required capability as described above is provided to the matching operations of the matching devices 40 and 42.

<Configuration of High Frequency Power Supply and Matching Device>

Figure 5:
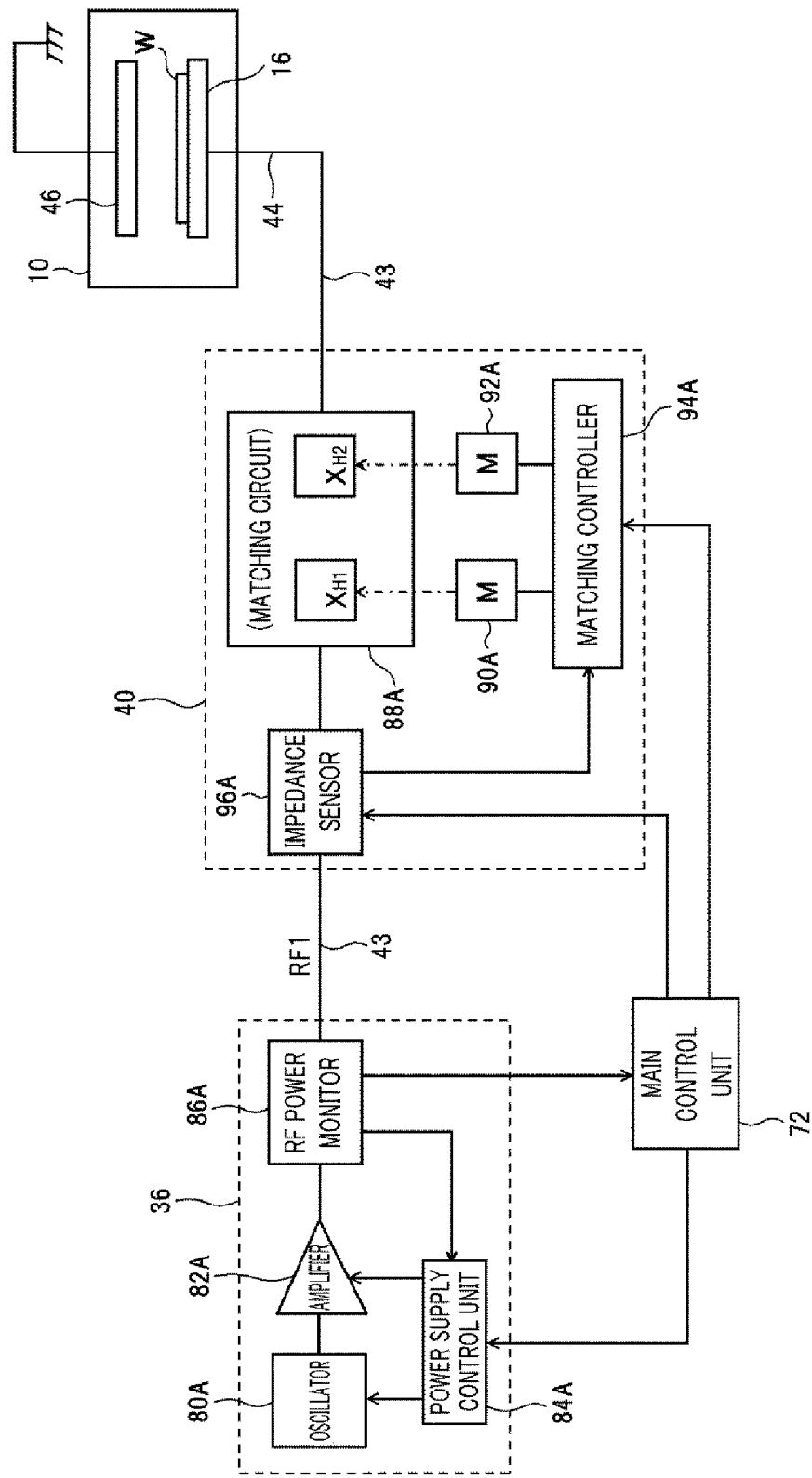
FIG. 5 is a block diagram showing a configuration of a matching device and a high frequency power supply for plasma generation.

FIG. 5 illustrates a configuration of the high frequency power supply 36 for plasma generation and a matching device 40.

The high frequency power supply 36 includes an oscillator 80A configured to generate a sine wave of a frequency (for example, 100 MHz) suitable for plasma generation; a power amplifier 82A configured to control a power of the sine wave outputted from the oscillator 80A and amplify the power with a variable gain or amplification factor; and a power supply control unit 84A configured to directly control the oscillator 80A and the power amplifier 82A in response to a control signal from the main control unit 72. The main control unit 72 also outputs control signals of typical power supply on/off or power interlock relation and data such as power set values as well as the modulation control pulse signal PS to the power supply control unit 84A. The main control unit 72 and the power supply control unit 84A constitute a power modulation unit of a high frequency power RF1.

The high frequency power supply 36 also includes a RF power monitor 86A provided. The RF power monitor 86A includes a directional coupler, a progressive wave power monitoring unit, and a reflection wave power monitoring unit (which are not illustrated). Herein, the directional coupler extracts signals corresponding to a RF power (progressive wave) propagating on the high frequency transmission line 43 in a forward direction and a RF power (reflection wave) propagating on the high frequency transmission line 43 in a backward direction. The progressive wave power monitoring unit is configured to output a signal indicating a power of a fundamental frequency progressive wave (about 100 MHz) included in the progressive wave propagating on the high frequency transmission line 43 based on a progressive wave power detection signal extracted by the directional coupler. This signal, i.e., a fundamental frequency progressive wave power measurement value, is sent to the power supply control unit 84A within the high frequency power supply 36 for power feedback control and also sent to the main control unit 72 for monitor display. The reflection wave power monitoring unit is configured to measure a power of a fundamental frequency reflection wave (about 100 MHz) included in the reflection wave returning back to the high frequency power supply 36 from plasma within the chamber 10, and also to measure a total power of all reflection wave spectra included in the reflection wave returning back to the high frequency power supply 36 from plasma within the chamber 10. A fundamental frequency reflection wave power measurement value outputted by the reflection wave power monitoring unit is sent to the main control unit 72 for monitor display, and a total reflection wave power measurement value is sent to the power supply control unit 84A within the high frequency power supply 36 as a monitor value for protecting the power amplifier.

The matching device 40 includes a matching circuit 88A including multiple, for example, two variable reactance elements (for example, capacitors or inductors) $X_{H1}$ and $X_{H2}$; a matching controller 94A configured to vary a reactance of the reactance elements $X_{H1}$ and $X_{H2}$ via actuators, for example, motors (M) 90A and 92A; and an impedance sensor 96A configured to measure load impedance including impedance of the matching circuit 88A on the high frequency transmission line 43.

The matching controller 94A is operated under control of the main control unit 72 and configured to vary a reactance of the reactance elements $X_{H1}$ and $X_{H2}$ by controlling the motors 90A and 92A by using a measurement value of the load impedance measured by the impedance sensor 96A as a feedback signal such that the measurement value of the load impedance can be equal or approximate to the matching point (typically, about 50Ω) corresponding to impedance on the side of the high frequency power supply 36.

Figure 6:
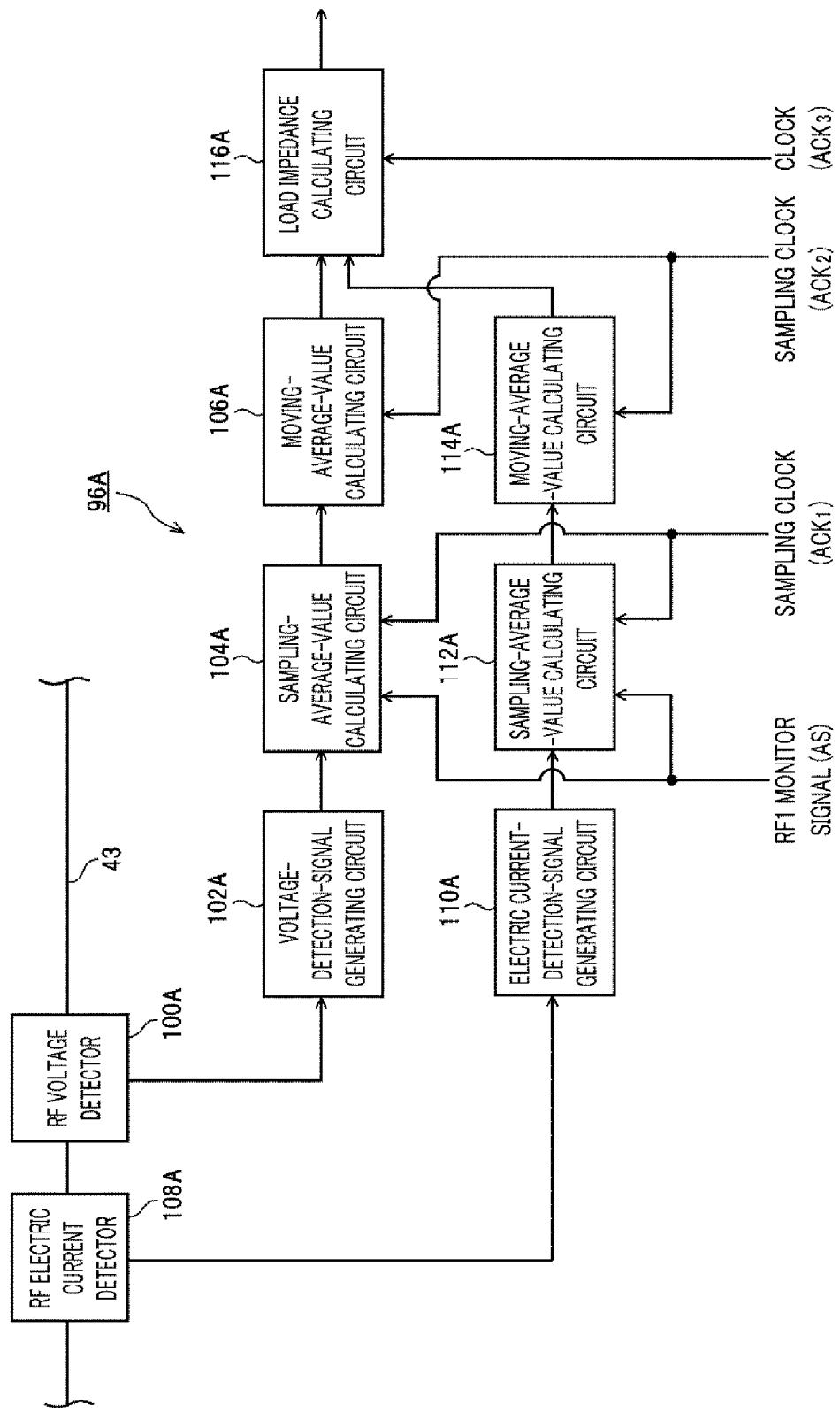
FIG. 6 is a block diagram showing an internal configuration of the matching device of FIG. 5.

FIG. 6 illustrates an internal configuration of the impedance sensor 96A. This impedance sensor 96A includes a RF voltage detector 100A of a voltage sensor system; a voltage-detection-signal generating circuit 102A; a sampling-average-value calculating circuit 104A and a moving-average-value calculating circuit 106A; a RF electric current detector 108A of an electric current sensor system; an electric current-detection-signal generating circuit 110A; a sampling-average-value calculating circuit 112A and a moving-average-value calculating circuit 114A; and a load impedance calculating circuit 116A.

The RF voltage detector 100A of the voltage sensor system is configured to detect a voltage of the high frequency power on the high frequency transmission line 43. The voltage-detection-signal generating circuit 102A includes, for example, a superheterodyne filter circuit, and is configured to generate a voltage detection signal corresponding to the high frequency power RF1 through analogue filtering of a high frequency voltage detection signal obtained from the RF voltage detector 100A.

The sampling-average-value calculating circuit 104A is operated in synchronization with the power modulation and configured to sample voltage detection signals obtained from the voltage-detection-signal generating circuit 102A with a preset frequency and calculate an average value of these signals during a preset monitoring time $T_H$ in each cycle of the pulse frequency $f_s$. In this configuration example, analogue voltage detection signals from the voltage-detection-signal generating circuit 102A are converted into digital signals by the sampling-average-value calculating circuit 104A. A clock $ACK_1$ for sampling and a RF1 monitor signal AS for indicating the monitoring time $T_H$ of the high frequency power RF1 are sent to the sampling-average-value calculating circuit 104A from the main control unit 72. The sampling-average-value calculating circuit 104A is required to process large quantities of signals at a high speed in synchronization with the sampling clock $ACK_1$ of several tens of MHz or more, and, thus, a FPGA (field programmable gate array) can be used appropriately.

The moving-average-value calculating circuit 106A is configured to calculate a moving average value of the voltage detection signals based on an average value of each cycle obtained from the sampling-average-value calculating circuit 104A. That is, the moving-average-value calculating circuit 106A is configured to sample consecutive N average values of the voltage detection signals obtained from the sampling-average-value calculating circuit 104A by a certain cycle, configured to calculate a moving average value with respect to the N average values, and configured to move a sampling range on a time axis by a desired movement pitch to repeat the moving average value calculation. A value of the movement pitch can be set optionally. The main control unit 72 outputs a clock $ACK_2$ for sampling to the moving-average-value calculating circuit 106A. The moving-average-value calculating circuit 106A is not particularly required to process signals at a high speed, and, thus, a typical CPU can be used appropriately therefore.

The RF electric current detector 108A of the electric current sensor system is configured to detect an electric current of the high frequency power on the high frequency transmission line 43. The electric current-detection-signal generating circuit 110A has the same configuration and the same function as the above-described voltage-detection-signal generating circuit 102A, and is configured to generate electric current detection signals corresponding to the high frequency power RF1. The sampling-average-value calculating circuit 112A has the same configuration and the same function as the above-described sampling-average-value calculating circuit 104A, and is configured to sample electric current detection signals obtained from the electric current-detection-signal generating circuit 110A with a preset frequency and calculate an average value of these signals during a preset monitoring time $T_H$ in each cycle of the pulse frequency $f_s$. The moving-average-value calculating circuit 114A has the same configuration and the same function as the above-described moving-average-value calculating circuit 106A, and is configured to calculate a moving average value of electric current detection signals based on an average value of each cycle obtained from the sampling-average-value calculating circuit 112A.

The load impedance calculating circuit 116A is configured to calculate a measurement value of load impedance with respect to the high frequency power supply 36 based on the moving average value of the voltage detection signals from the moving-average-value calculating circuit 106A and the moving average value of the electric current detection signals obtained from the moving-average-value calculating circuit 114A. The measurement value of the load impedance outputted from the load impedance calculating circuit 116A is updated in synchronization with the sampling clock $ACK_2$. The main control unit 72 outputs a clock $ACK_3$ to the load impedance calculating circuit 116A. Typically, a measurement value of the load impedance outputted from the load impedance calculating circuit 116A includes an absolute value and a phase measurement value of the load impedance.

The matching controller 94A within the matching device 40 is configured to respond to the load impedance measurement value measured from the impedance sensor 96A and vary a reactance of the reactance elements $X_{H1}$ and $X_{H2}$ within the matching circuit 88A by controlling the motors 90A and 92A such that a phase of the load impedance measurement value is about zero (0) and an absolute value thereof is about 50Ω.

The load impedance measurement value outputted from the impedance sensor 96A to the matching controller 94A is updated in synchronization with the power modulation (precisely, on a cycle for moving average value calculation). The matching controller 94A does not stop a matching operation, i.e., does not stop the control of a reactance of the reactance elements $X_{H1}$ and $X_{H2}$ during the update, and continuously controls the motors 90A and 92A such that the load impedance measurement value right before the update can be equal and approximate to the matching point.

In this example embodiment, a dual sampling averaging process is performed on the RF voltage and electric current measurement values by the sampling-average-value calculating circuits 104A and 112A and the moving-average-value calculating circuits 106A and 114A. As a result, an update speed of the load impedance measurement value outputted from the impedance sensor 96A can be matched well with a driving control speed of the motors 90A and 92A (i.e., reactance control of the reactance elements $X_{H1}$ and $X_{H2}$) in the matching controller 94A. Thus, even if a pulse frequency for power modulation is set on the order of several tens of kHz or more, in a matching operation of the matching device 40, malfunction or life-shortening of operating components (particularly, reactance elements $X_{H1}$ and $X_{H2}$) is not caused, and it is possible to accurately follow a change in the load (plasma) impedance.

Further, in this example embodiment, as described above, automatic matching is carried out such that a measurement value of the load impedance obtained based on the voltage detection signals and the electric current detection signals corresponding to the high frequency power RF1 obtained on the high frequency transmission line 43 can be equal or approximate to the matching point, and, thus, even if there are frequency components in side bands (modulation parts of the pulse frequency $f_s$) caused by the modulation frequency around (in both sides of) the high frequency power RF1 on a frequency axis, a matching operation of the matching device 40 can have an effect on the high frequency power RF1. Therefore, as depicted in FIG. 3B, a reflection wave power monitor unit within the RF power monitor 86A can obtain a monitoring result that the power of the fundamental frequency reflection wave $f_{RF1}$ is remarkably decreased.

Figure 7:
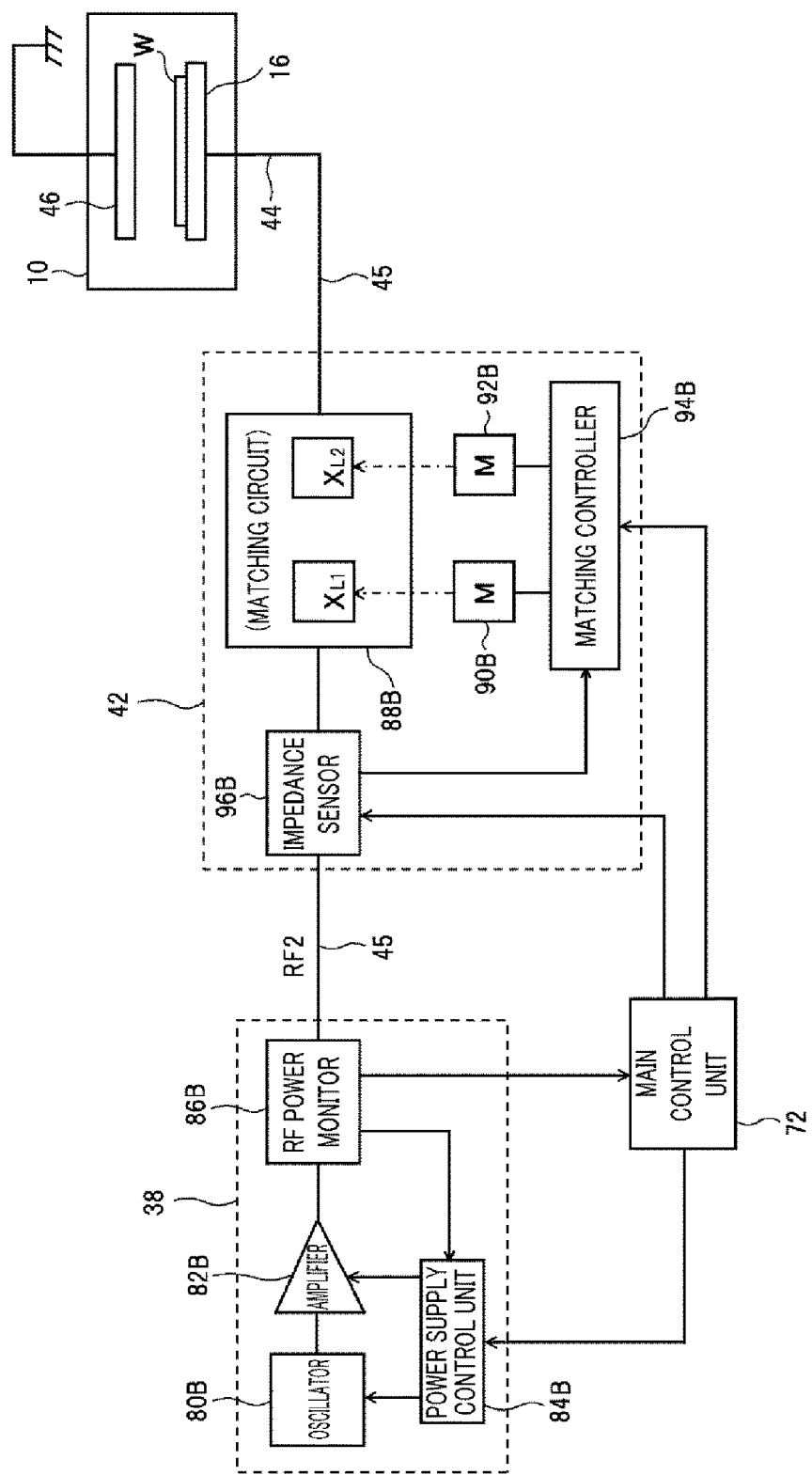
FIG. 7 is a block diagram showing a configuration of a matching device and a high frequency power supply for ion attraction.

FIG. 7 illustrates a configuration of the high frequency power supply 38 for ion attraction and the matching device 42 in accordance with the present example embodiment.

The high frequency power supply 38 includes an oscillator 80B configured to generate a sine wave of a frequency (for example, 13.56 MHz) for ion attraction; a power amplifier 82B configured to control a power of the sine wave outputted from the oscillator 80B and amplify the power with a variable gain or amplification factor; a power supply control unit 84B configured to directly control the oscillator 80B and the power amplifier 82B in response to a control signal from the main control unit 72; and a RF power monitor 86B. The components 80B to 86B within the high frequency power supply 38 respectively have the same configurations and the same functions as the components 80A to 86A within the high frequency power supply 36 except that the frequency (13.56 MHz) of the oscillator 80B is different from the frequency (100 MHz) of the oscillator 80A. Further, the main control unit 72 and the power supply control unit 84B constitute a power modulation unit of a high frequency power RF2.

The matching device 42 includes a matching circuit 88B including multiple, for example, two variable reactance elements (for example, capacitors or inductors) $X_{L1}$ and $X_{L2}$; a matching controller 94B configured to vary a reactance of the reactance elements $X_{L1}$ and $X_{L2}$ via actuators, for example, motors (M) 90B and 92B; and an impedance sensor 96B configured to measure load impedance including impedance of the matching circuit 88B on the high frequency transmission line 45.

The matching controller 94B is operated under control of the main control unit 72 and configured to vary a reactance of the reactance elements $X_{L1}$ and $X_{L2}$ by controlling the motors 90B and 92B by using a measurement value of the load impedance measured by the impedance sensor 96B as a feedback signal such that the measurement value of the load impedance can be equal or approximate to the matching point (typically, about 50Ω) corresponding to impedance on the side of the high frequency power supply 38.

Figure 8:
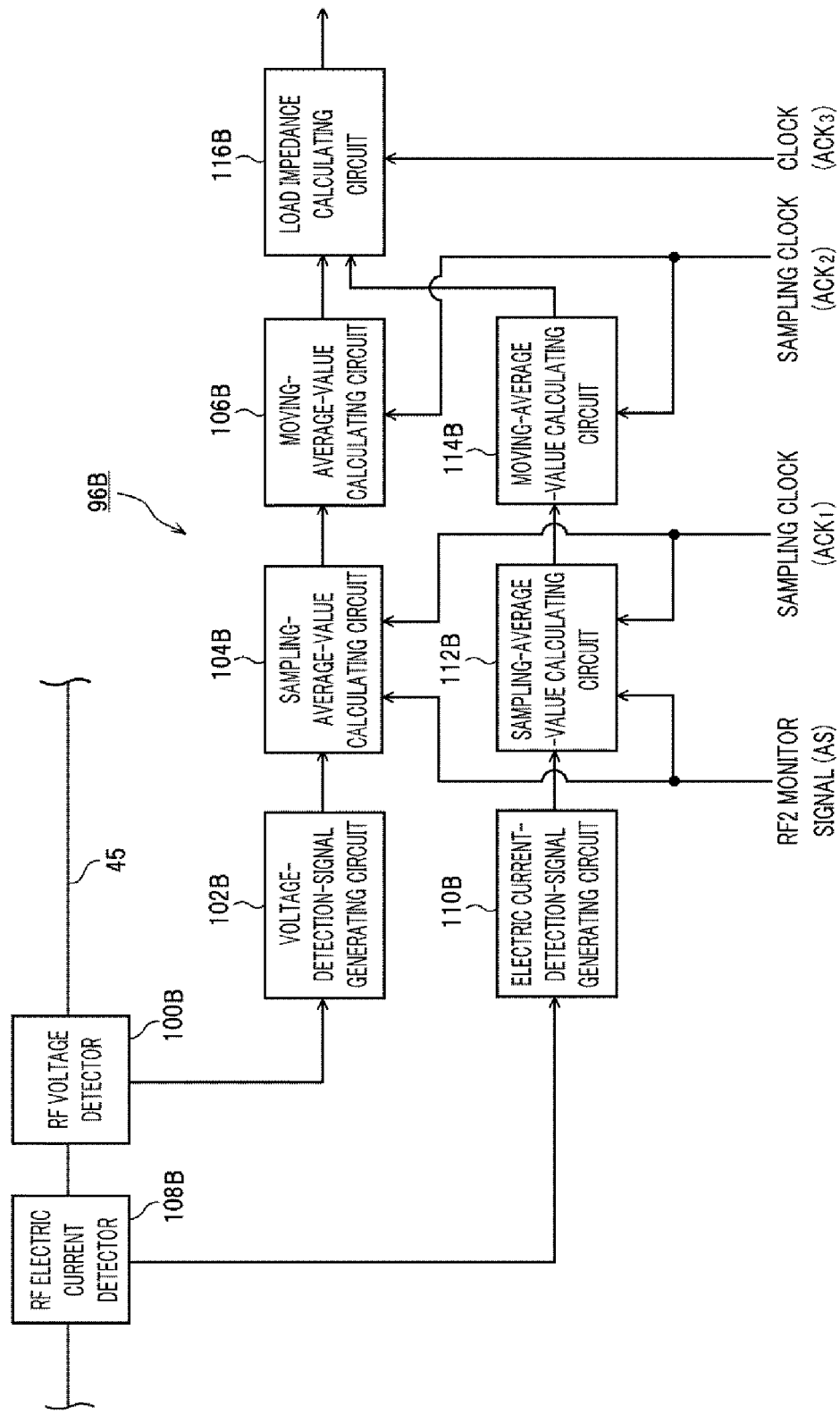
FIG. 8 is a block diagram showing an internal configuration of the matching device of FIG. 7.

FIG. 8 illustrates an internal configuration of the impedance sensor 96B. This impedance sensor 96B includes a RF voltage detector 100B of a voltage sensor system; a voltage-detection-signal generating circuit 102B; a sampling-average-value calculating circuit 104B and a moving-average-value calculating circuit 106B; a RF electric current detector 108B of an electric current sensor system; an electric current-detection-signal generating circuit 110B; a sampling-average-value calculating circuit 112B and a moving-average-value calculating circuit 114B; and a load impedance calculating circuit 116B.

The RF voltage detector 100B of the voltage sensor system is configured to detect a voltage of the high frequency power on the high frequency transmission line 45. The voltage-detection-signal generating circuit 102B includes, for example, a superheterodyne filter circuit, and is configured to generate a voltage detection signal corresponding to the high frequency power RF1 through analogue filtering of a high frequency voltage detection signal obtained from the RF voltage detector 100B.

The sampling-average-value calculating circuit 104B is operated in synchronization with the power modulation and configured to sample electric current detection signals obtained from the electric current-detection-signal generating circuit 110B with a preset frequency and calculate an average value of these signals during a preset monitoring time $T_L$ in each cycle of the pulse frequency $f_s$. In this configuration example, analogue electric current detection signals from the electric current-detection-signal generating circuit 110B are converted into digital signals by the sampling-average-value calculating circuit 104B. A clock $BCK_1$ for sampling and a RF2 monitor signal BS for indicating the monitoring time $T_L$ of the high frequency power RF2 are sent to the sampling-average-value calculating circuit 104B from the main control unit 72.

The moving-average-value calculating circuit 106B is configured to calculate a moving average value of the electric current detection signals based on an average value of each cycle obtained from the sampling-average-value calculating circuit 104B. That is, the moving-average-value calculating circuit 106B is configured to sample consecutive N average values of the electric current detection signals obtained from the sampling-average-value calculating circuit 104B by a certain cycle, configure to calculate a moving average value with respect to the N average values, and configured to move a sampling range on a time axis by a desired movement pitch to repeat the moving average value calculation. A value of the movement pitch can be set optionally.

The RF electric current detector 108B of the electric current sensor system is configured to detect an electric current of the high frequency power in the high transmission line 45. The electric current-detection-signal generating circuit 110B has the same configuration and the same function as the above-described voltage-detection-signal generating circuit 102B, and is configured to generate electric current detection signals corresponding to the high frequency power RF2. The sampling-average-value calculating circuit 112B has the same configuration and the same function as the above-described sampling-average-value calculating circuit 104B, and is configured to sample electric current detection signals obtained from the electric current-detection-signal generating circuit 110B with a preset frequency and calculate an average value of these signals during a preset monitoring time $T_{RF2}$ in each cycle of the pulse frequency $f_s$. The moving-average-value calculating circuit 114B has the same configuration and the same function as the above-described moving-average-value calculating circuit 106B, and is configured to calculate a moving average value of electric current detection signals based on an average value of each cycle obtained from the sampling-average-value calculating circuit 112B.

The load impedance calculating circuit 116B is configured to calculate a measurement value of a load impedance with respect to the high frequency power supply 38 based on the moving average value of the voltage detection signals from the moving-average-value calculating circuit 106B and the moving average value of the electric current detection signals obtained from the moving-average-value calculating circuit 114B. The measurement value of the load impedance outputted from the load impedance calculating circuit 116B is updated in synchronization with a sampling clock $BCK_2$ for moving average value calculation. The main control unit 72 outputs a required clock $BCK_3$ to the load impedance calculating circuit 116B. Typically, a measurement value of the load impedance outputted from the load impedance calculating circuit 116B includes an absolute value and a phase measurement value of the load side impedance.

The matching controller 94B within the matching device 42 is configured to respond to the load impedance measurement value measured from the impedance sensor 96B and vary a reactance of the reactance elements $X_{L1}$ and $X_{L2}$ within the matching circuit 88B by controlling the motors 90B and 92B such that a phase of the load impedance measurement value is about zero (0) and an absolute value thereof is about 50Ω.

The load impedance measurement value outputted from the impedance sensor 96B to the matching controller 94B is updated in synchronization with the power modulation (precisely, on a cycle for moving average value calculation). The matching controller 94B does not stop a matching operation, i.e., does not stop the control of a reactance of the reactance elements $X_{L1}$ and $X_{L2}$ during the update, and continuously controls the motors 90B and 92B such that the load impedance measurement value right before the update can be equal and approximate to the matching point.

In this example embodiment, a dual sampling averaging process is performed on the RF voltage and electric current measurement values by the sampling-average-value calculating circuits 104B and 112B and the moving-average-value calculating circuits 106B and 114B. As a result, an update speed of the load impedance measurement value outputted from the impedance sensor 96B can be matched well with a driving control speed of the motors 90B and 92B (i.e., reactance control of the reactance elements $X_{L1}$ and $X_{L2}$) in the matching controller 94B. Thus, even if a pulse frequency for power modulation is set on the order of several tens of kHz or more, in a matching operation of the matching device 42, malfunction or life-shortening of operating components (particularly, reactance elements $X_{L1}$ and $X_{L2}$) is not caused, and it is possible to accurately follow a change in the load (plasma) impedance.

Further, in this example embodiment, as described above, automatic matching is carried out such that a measurement value of the load impedance obtained based on the voltage detection signals and the electric current detection signals corresponding to the high frequency power RF2 obtained on the high frequency transmission line 45 can be equal or approximate to the matching point. That is, even if there are frequency components in side bands (modulation parts of the pulse frequency) caused by the modulation frequency $f_s$ around (in both sides of) the high frequency power RF2 on a frequency axis, a matching operation of the matching device 42 can have an effect on the high frequency power RF2. Therefore, as depicted in FIG. 4B, a reflection wave power monitor unit within the RF power monitor 86B can obtain a monitoring result that the power of the fundamental frequency reflection wave $f_{RF2}$ is remarkably decreased.

<Operation of Matching Device>

Figure 9:
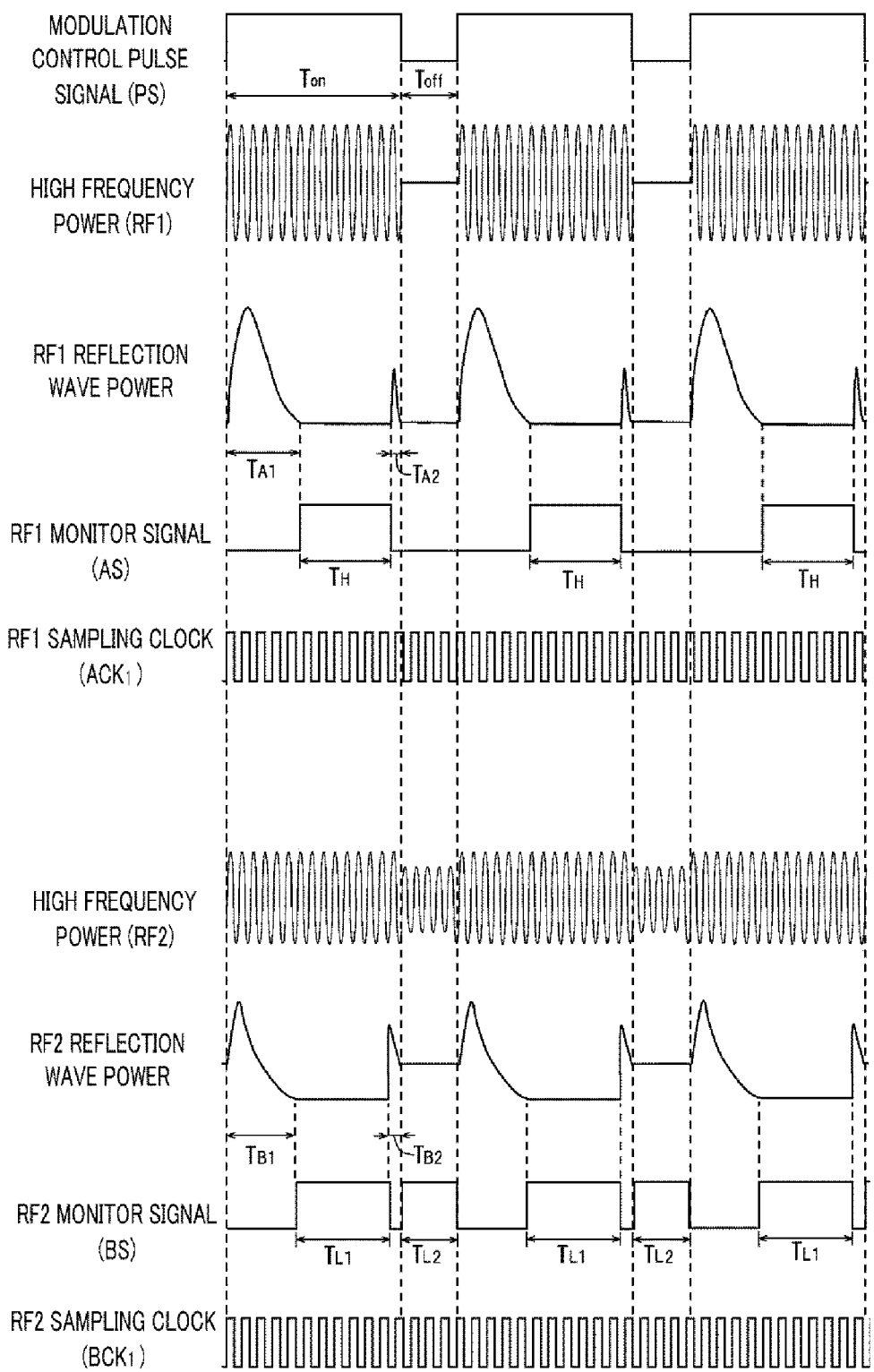
FIG. 9 provides waveform diagrams for explaining operations of the matching device in accordance with the example embodiment.

Hereinafter, referring to FIG. 9, as an example, operations of the matching devices 40 and 42 in the first power modulation process will be explained in more detail.

When a dry etching process is performed by the first power modulation process, the main control unit 72 outputs a modulation control pulse signal PS to the high frequency power supply 36 for plasma generation. The high frequency power supply 36 turns on/off the high frequency power RF1 in synchronization with the modulation control pulse signal PS, as depicted in FIG. 9.

In this case, a monitoring time $T_H$ for a sampling averaging process sent to the sampling-average-value calculating circuits 104A and 112A within the matching device 40 of the high frequency power RF1 by a monitor signal AS from the main control unit 72 is set within an on-period $T_{on}$ in each cycle of the pulse frequency $f_s$. Desirably, as depicted in FIG. 9, the monitoring time $T_H$ is set within time ranges except transient times $T_{A1}$ and $T_{A2}$ right after starting and right before ending the on-period $T_{on}$ during which a power of the RF1-based reflection wave is abruptly increased on the high frequency transmission line 43. Here, the monitoring time $T_H$ is set only within the on-period $T_{on}$ not within the off-period $T_{off}$. Thus, the matching device 40 functions only when the high frequency power RF1 is turned on.

The sampling-average-value calculating circuits 104A and 112A sample voltage detection signals and electric current detection signals in synchronization with a sampling clock $ACK_1$ during this monitoring time $T_H$ and then calculate average values thereof.

By way of example, a pulse frequency $f_s$ is 10 kHz, a duty ratio $D_s$ is 80%, a frequency of the sampling clock $ACK_1$ is 40 MHz, and the monitoring time $T_H$ is half (50%) the length of the on-period $T_{on}$. In this case, in each cycle of the pulse frequency $f_s$, the sampling is carried out 1600 times during the monitoring time $T_H$ in the on-period $T_{on}$, to obtain one average value data a, which indicates the average of 1600 values.

Figure 10:
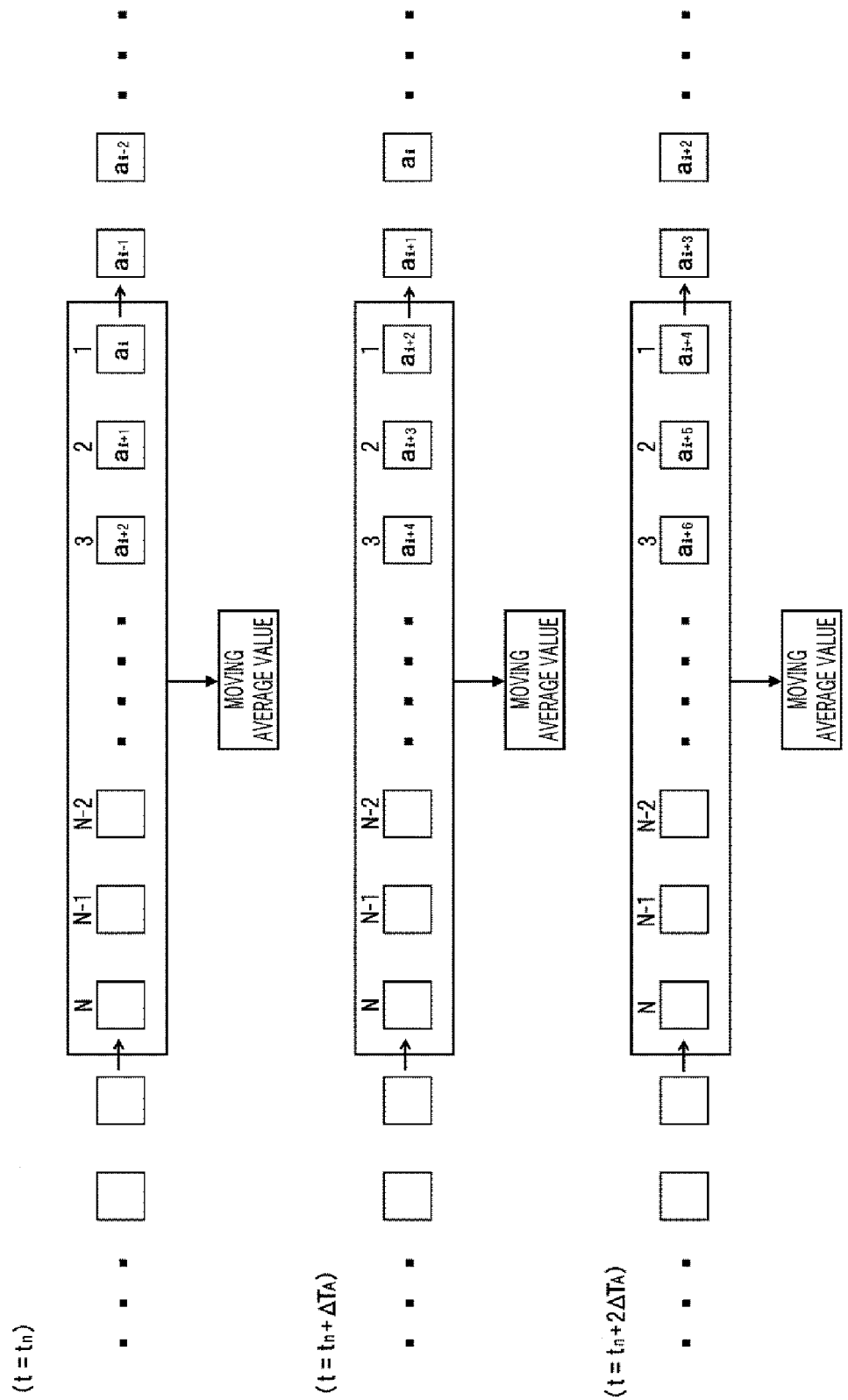
FIG. 10 provides diagrams for explaining an operation of a moving average value calculation in accordance with the example embodiment.

As depicted in FIG. 10, the moving-average-value calculating circuit 106A of the voltage sensor system within the matching device 40 receives the average data a outputted from the sampling-average-value calculating circuit 104A in each cycle of the pulse frequency $f_s$; samples consecutive N average values a of the voltage detection signals at a cycle $T_A$ of a sampling clock $ACK_2$; calculates a moving average value of the sampled N average value data a; and moves a sampling range on a time axis by a movement pitch according to the cycle $T_A$ of the sampling clock $ACK_2$ to repeat the moving average value calculation.

By way of example, when the pulse frequency $f_s$ is 10 kHz, if the cycle $T_A$ of the sampling clock $ACK_2$ is 200 μsec (5 kHz in terms of frequency), as depicted in FIG. 10, a movement pitch (the number of data updated among average value data a at a front side on a time axis and average value data a at a rearmost side thereof through one-time moving average value calculation) is "2". As such, if a value of the movement pitch is optionally set to "m" (m is an integer of 2 or more), a frequency of the sampling clock signal $ACK_2$ may be determined as being 1/m times of the pulse frequency $f_s$.

The moving-average-value calculating circuit 114A of the electric current sensor system within the matching device 40 is also operated at the substantially same time as the moving-average-value calculating circuit 106A of the voltage sensor system, and performs the same signal process on the average value of the electric current detection signals.

If the first power modulation process is used, in the matching device 40 of the high frequency power RF1 for plasma generation, the sampling-average-value calculating circuits 104A and 112A perform signal processes on the sampling averages at a high speed during the monitoring time $T_H$ set within the on-period $T_{on}$ (desirably, within time rages expect the transient time in which the power of the reflection wave is high) in each cycle of the pulse frequency $f_s$, and the moving-average-value calculating circuits 106A and 114A perform signal processes on the moving averages for multiple cycles. Further, according to a load impedance measurement value, which is obtained from the load impedance calculating circuit 116A and updated in synchronization with a sampling clock of the moving average, the matching controller 94A continuously controls a reactance of the reactance elements $X_{H1}$ and $X_{H2}$. Thus, even if the pulse frequency for the power modulation is set on the order of several tens of kHz or more and a duty ratio $D_s$ is set to a certain level, in a matching operation of the matching device 40, malfunction or life-shortening of operating components (particularly, reactance elements $X_{H1}$ and $X_{H2}$) may not be caused, and it is possible to accurately follow the change in the load (plasma) impedance.

Meanwhile, in the first power modulation process, the modulation control pulse signal PS is not sent to the high frequency power supply 38 for ion attraction. Therefore, the high frequency power supply 38 continuously outputs the high frequency power RF2 at a preset level.

In this case, a monitoring time $T_L$ for a sampling averaging process sent to the sampling-average-value calculating circuits 104B and 112B within the matching device 42 of the high frequency power RF2 by a monitor signal BS from the main control unit 72 is set for both of an on-period $T_{on}$ and an off-period $T_{off}$ in each cycle of the pulse frequency $f_s$. Desirably, as depicted in FIG. 9, the monitoring time $T_{L1}$ is set within time ranges except transient times $T_{B1}$ and $T_{B2}$ right after starting and right before ending the on-period $T_{on}$ during which a power of the RF2-based reflection wave is abruptly increased on the high frequency transmission line 45. Meanwhile, another monitoring time $T_{L2}$ is set within all time ranges of the off-period $T_{off}$.

The sampling-average-value calculating circuits 104B and 112B sample voltage detection signals and electric current detection signals in synchronization with a sampling clock $BCK_1$ during the former monitoring time $T_{L1}$ in each cycle of the pulse frequency $f_s$ and calculate average values b thereof. Then, the sampling-average-value calculating circuits 104B and 112B also sample voltage detection signals and electric current detection signals in synchronization with the sampling clock $BCK_1$ during the latter monitoring time $T_{L2}$ and calculate average values c thereof.

By way of example, a pulse frequency $f_s$ is 10 kHz, a duty ratio $D_s$ is 80%, a frequency of the sampling clock $BCK_1$ is 40 MHz, and the former monitoring time $T_{L1}$ is half (50%) the length of the on-period $T_{on}$ and the latter monitoring time $T_{L2}$ has the entire length of the off-period $T_{off}$. In this case, in each cycle of the pulse frequency $f_s$, the sampling is carried out 1600 times during the former monitoring time $T_{L1}$ to obtain one average value data b, which indicates the average of 1600 values. Further, the sampling is carried out 800 times during the latter monitoring time $T_{L2}$ to obtain one average value data c, which indicates the average of 800 values.

Figure 11:
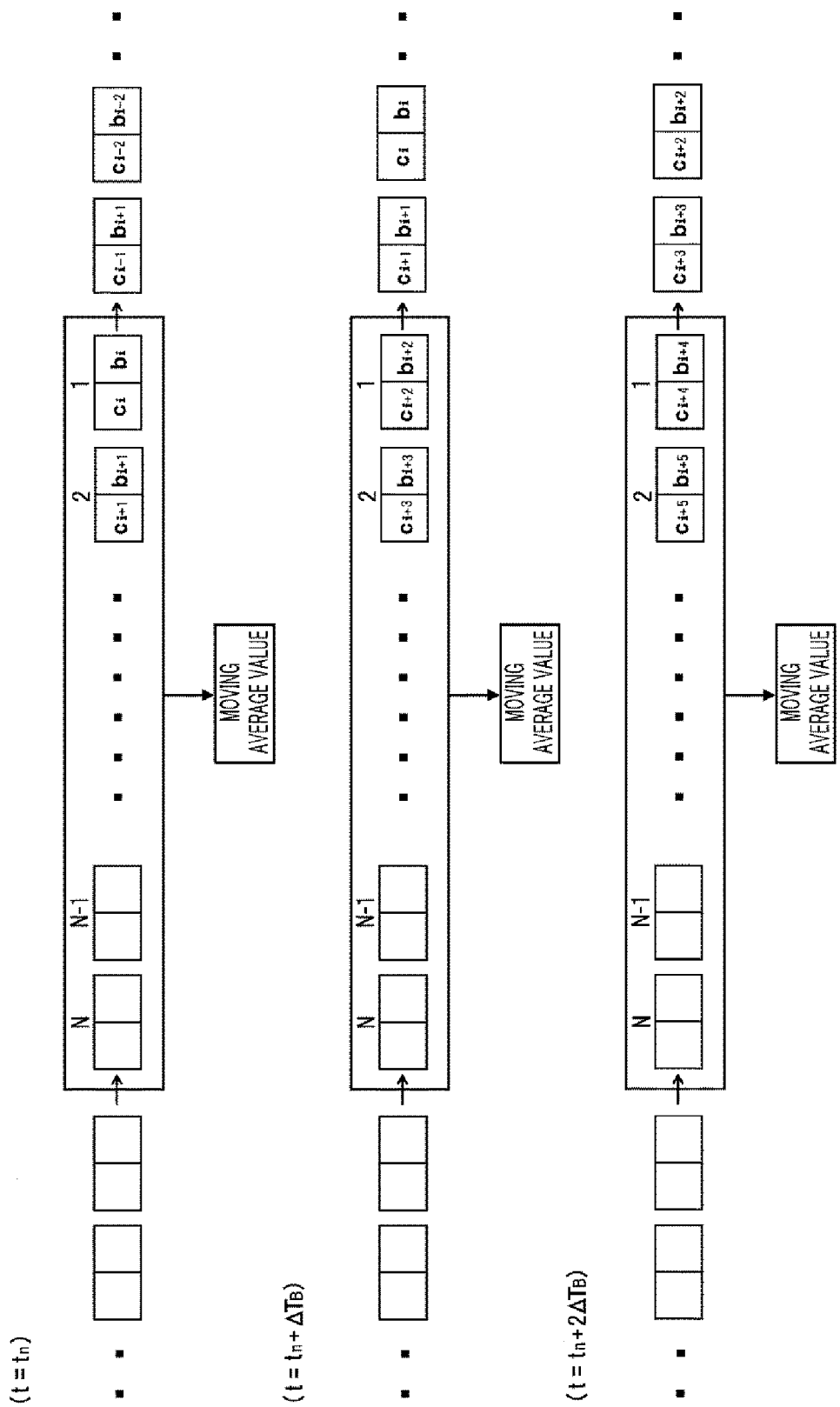
FIG. 11 provides diagrams for explaining an operation of a moving average value calculation in accordance with the example embodiment.

As depicted in FIG. 11, the moving-average-value calculating circuit 106B of the voltage sensor system within the matching device 42 receives the average data b and c outputted from the sampling-average-value calculating circuit 104B in each cycle of the pulse frequency $f_s$; samples consecutive N groups of the average values b and c of the voltage detection signals at a cycle $T_B$ of a sampling clock $BCK_2$; calculates a moving average of the N groups of the average value data b and c; and moves a sampling range on a time axis by a movement pitch according to the cycle $T_B$ of the sampling clock $BCK_2$ to repeat the moving average value calculation.

By way of example, when the pulse frequency $f_s$ is 10 kHz, if the cycle $T_B$ of the sampling clock $BCK_2$ is 200 μsec (5 kHz in terms of frequency), as depicted in FIG. 11, a movement pitch (the number of groups updated among average value data b and c at a front side on a time axis and average value data b and c at a rearmost side through one-time moving average value calculation) is "2". As such, if a value of the movement pitch is optionally set to "m" (m is an integer of 2 or more), a frequency of the sampling clock signal $BCK_2$ may be determined as being 1/m times of the pulse frequency $f_s$.

The moving-average-value calculating circuit 114B of the electric current sensor system within the matching device 42 is also operated at the substantially same time as the moving-average-value calculating circuit 106B of the voltage sensor system, and performs the same signal process on the average value of the electric current detection signals.

As such, in the present example embodiment, the sampling-average-value calculating circuits 104B and 112B perform signal processes on the sampling averages at a high speed during the former and latter monitoring times $T_{L1}$ and $T_{L2}$ set within the on-period $T_{on}$ (desirably, within time ranges expect the transient time during which the power of the reflection wave is high) and the off-period $T_{off}$ respectively, in each cycle of the pulse frequency $f_s$, and the moving-average-value calculating circuits 106B and 114B perform signal processes on the moving averages for multiple cycles. Further, according to a load impedance measurement value, which is obtained from the load impedance calculating circuit 116B and updated in synchronization with a sampling clock of the moving average, the matching controller 94B continuously controls a reactance of the reactance elements $X_{L1}$ and $X_{L2}$. Thus, even if the pulse frequency for the power modulation is set on the order of several tens of kHz or more and a duty ratio $D_s$ is set to a certain level, in a matching operation of the matching device 42, malfunction or life-shortening of operating components (particularly, reactance elements $X_{L1}$ and $X_{L2}$) may not be caused, and it is possible to accurately follow the change in the load (plasma) impedance.

Figure 12:
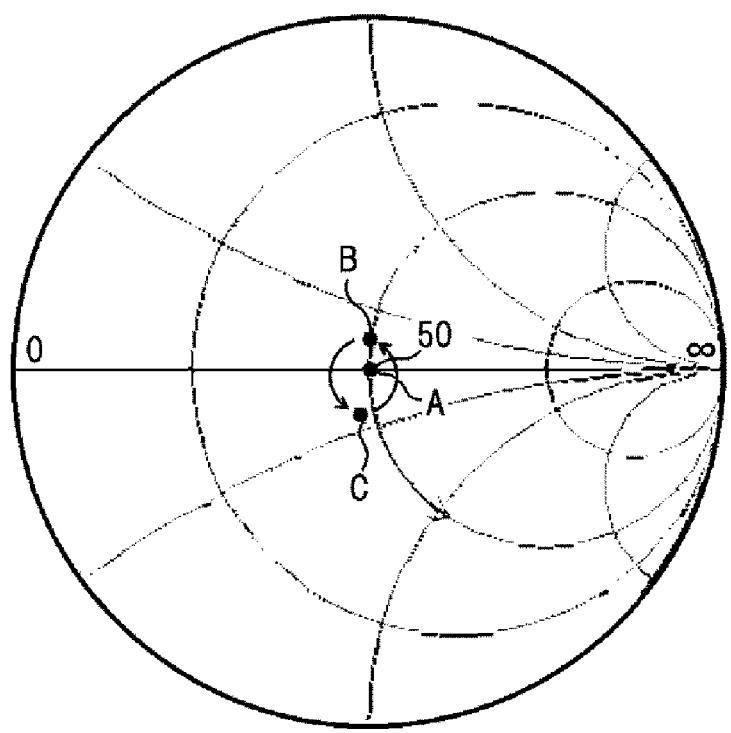
FIG. 12 shows a distribution (example) of matching operation points on the Smith chart in accordance with the example embodiment.

Herein, the matching device 40 of the high frequency power RF1 just needs to perform a matching operation on the impedance of plasma during the on-period $T_{on}$ as described above, and, thus, as shown on the Smith chart of FIG. 12, the matching operation point A can be equal or as close as possible to the matching point (about 50Ω).

Meanwhile, the matching device 42 of the high frequency power RF2 performs a matching operation on both of the impedance of plasma during the on-period $T_{on}$ and the impedance of plasma during the off-period $T_{off}$, and, thus, it is operated to establish the semi-matched state rather than the fully matched state. Herein, since a dual sampling averaging process is performed as described above in the matching device 42, between the on-period $T_{on}$ and the off-period $T_{off}$, a matching degree is different depending on the monitoring times (sampling periods) $T_{L1}$ and $T_{L2}$, and is closer to a fully matched state during a relatively long on-period as compared with a short on-period. Therefore, if a duty ratio $D_s$ is sufficiently high as depicted in FIG. 9, a matching point B during the on-period $T_{on}$ is closer to the matching point than a matching point C during the off-period $T_{off}$ as shown on the Smith chart in FIG. 12. Further, the power of the RF2 reflection wave during the monitoring times (sampling periods) $T_{L1}$ and $T_{L2}$ is inversely proportional to the monitoring time, and is higher during the off-period $T_{off}$ than during the on-period $T_{on}$ as depicted in FIG. 9.

In the example embodiments, the term "fully matched state" refers to a state in which a matching operation point aims to reach the matching point (about 50Ω) regardless of the on-period $T_{on}$ or the off-period $T_{off}$, and is within a certain (first) approximate range. Further, the term "semi-matched state" refers to a state in which a matching operation point moves around the matching point (about 50Ω) based on a difference in the load impedance between the on-period $T_{on}$ and the off-period $T_{off}$, and is within a certain (second) approximate range greater than the first approximate range.

Even if the power modulation is performed on the high frequency power RF2 for ion attraction by the second power modulation process, the same operation as described above is carried out in both of the matching devices 40 and 42 just by replacing the high frequency power RF1 (matching device 40) with the high frequency power RF2 (matching device 42), and, thus, the same effect as described above can be obtained.

<Another Example Embodiment or Modification Example>

The preferable example embodiment has been explained, but the present disclosure is not limited to the above example embodiment and can be modified in various ways within a technical scope thereof.

Figure 13:
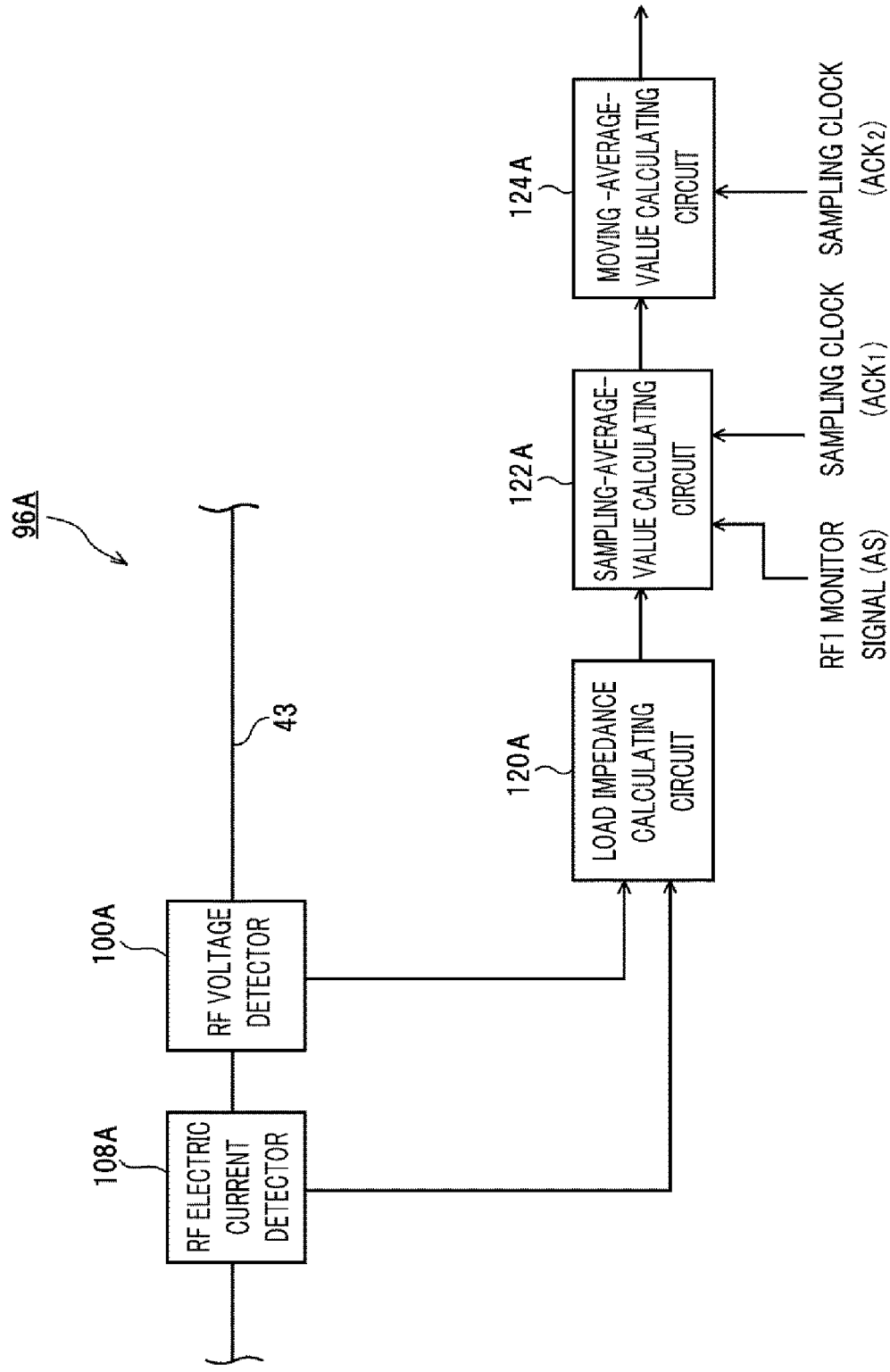
FIG. 13 is a block diagram showing a configuration of an impedance sensor in accordance with a modification example.

By way of example, as depicted in FIG. 13, the impedance sensor 96A within the matching device 40 may include the RF voltage detector 100A, the RF electric current detector 108A, a load impedance calculating circuit 120A, a sampling-average-value calculating circuit 122A, and a moving-average-value calculating circuit 124A.

Herein, the load impedance calculating circuit 120A is configured to calculate a measurement value of load impedance on the high frequency transmission line 43 based on the RF voltage detection signals and the RF electric current detection signals obtained from the RF voltage detector 100A and the RF electric current detector 108A, respectively. The load impedance calculating circuit 120A may be an analogue circuit and desirably, may be a digital circuit.

The sampling-average-value calculating circuit 122A and the moving-average-value calculating circuit 124A may perform the same sampling average process as the sampling-average-value calculating circuits 104A and 112A and the moving-average-value calculating circuits 106A and 114A of the above example embodiment just by replacing a signal to be processed with a load impedance measurement value.

In this case, the matching controller 94A (FIG. 5) controls a reactance of the reactance elements $X_{H1}$ and $X_{H2}$ via the motors 90A and 92A such that a load impedance measurement value obtained from the moving-average-value calculating circuit 124A can be equal or approximate to the matching point corresponding to impedance on the side of the high frequency power supply 36.

Figure 14:
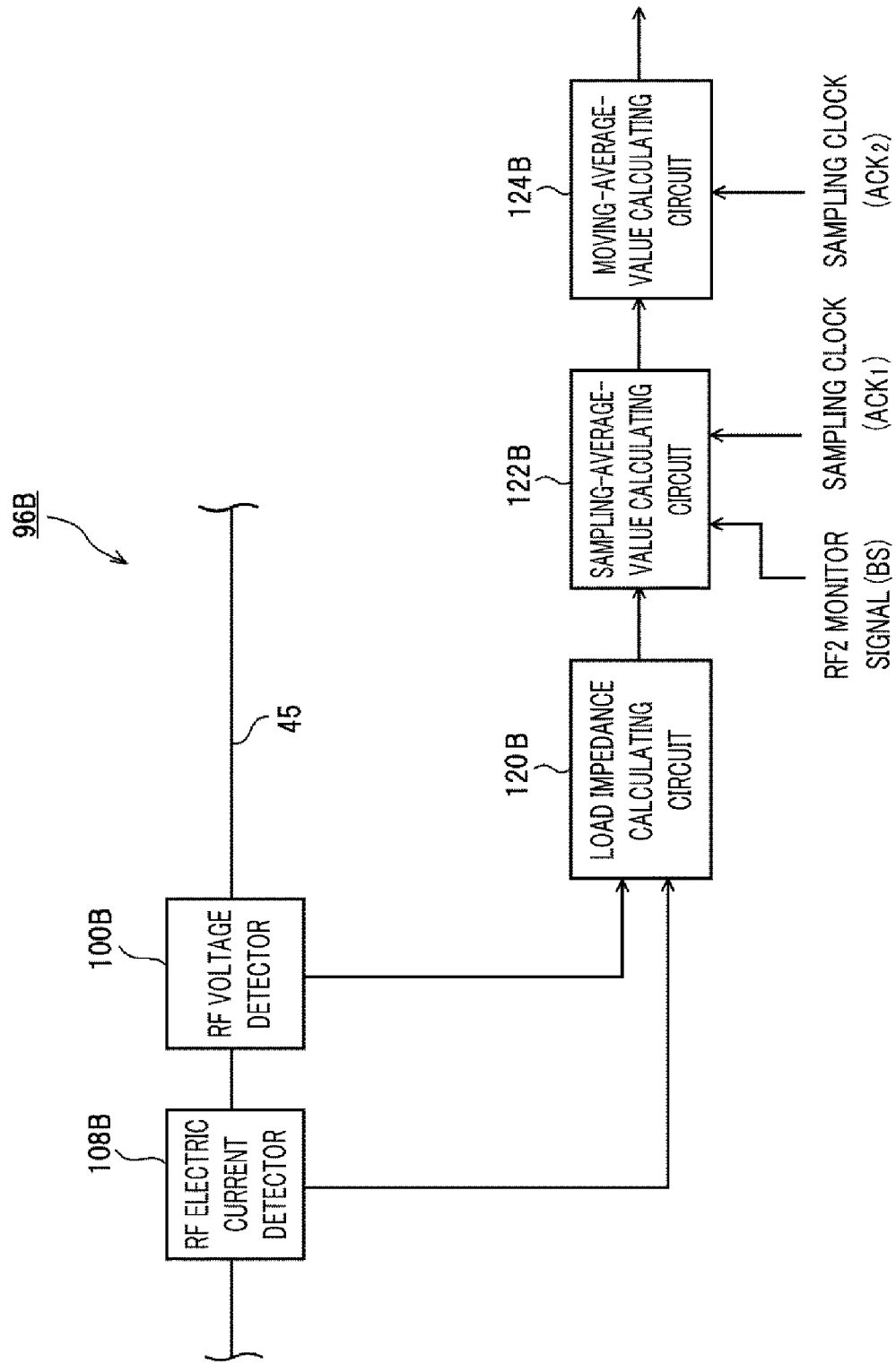
FIG. 14 is a block diagram showing a configuration of an impedance sensor in accordance with a modification example.

Likewise, as depicted in FIG. 14, the impedance sensor 96B within the matching device 42 may include the RF voltage detector 100B, the RF electric current detector 108B, a load impedance calculating circuit 120B, a sampling-average-value calculating circuit 122B, and a moving-average-value calculating circuit 124B.

Herein, the load impedance calculating circuit 120B is configured to calculate a measurement value of load impedance on the high frequency transmission line 45 based on the RF voltage detection signals and the RF electric current detection signals obtained from the RF voltage detector 100B and the RF electric current detector 108B, respectively. The load impedance calculating circuit 120B may be an analogue circuit and desirably, may be a digital circuit.

The sampling-average-value calculating circuit 122B and the moving-average-value calculating circuit 124B may perform the same sampling average process as the sampling-average-value calculating circuits 104B and 112B and the moving-average-value calculating circuits 106B and 114B of the above example embodiment just by replacing a signal to be processed with a load impedance measurement value.

In this case, the matching controller 94B (FIG. 7) controls a reactance of the reactance elements $X_{L1}$ and $X_{L2}$ via the motors 90B and 92B such that a load impedance measurement value obtained from the moving-average-value calculating circuit 124B can be equal or approximate to the matching point corresponding to impedance on the side of the high frequency power supply 38.

In the example embodiments, in the first power modulation process, a first period during which the high frequency power RF1 has a first level and a second period during which the high frequency power RF1 has a second level lower than the first level can be alternately repeated at a certain pulse frequency. Likewise, in the second power modulation process, a first period during which the high frequency power RF2 has a first level and a second period during which the high frequency power RF2 has a second level lower than the first level can be alternately repeated at a certain pulse frequency.

In the above example embodiment (FIG. 1), the high frequency power RF1 for plasma generation is applied to the susceptor (lower electrode) 16. However, the high frequency power RF1 for plasma generation can also be applied to the upper electrode 46.

The example embodiments are not limited to a capacitively coupled plasma etching apparatus and can be applied to a capacitively coupled plasma processing apparatus configured to perform various plasma processes such as plasma CVD, plasma ALD, plasma oxidation, plasma nitrification, sputtering, and the like. Further, the processing target substrate of the example embodiments may not be limited to the semiconductor wafer, but various types of substrates for a flat panel display, an organic EL or a solar cell, or a photo mask, a CD substrate, and a printed circuit board may also be used.

EXPLANATION OF REFERENCE NUMERALS

10: Chamber
16: Susceptor (Lower electrode)
36: High frequency power supply (for plasma generation)
38: High frequency power supply (for ion attraction)
40, 42: Matching devices
43, 45: High frequency transmission lines
46: Upper electrode (Shower head)
56: Processing gas supply source
72: Main control unit
88A, 88B: Matching circuits
94A, 94B: Matching controllers
96A, 96B: Impedance sensors
100A, 100B: RF voltage detectors
102A, 102B: Voltage-detection-signal generating circuits
104A, 104B: Sampling-average-value calculating circuits
112A, 112B: Sampling-average-value calculating circuits
106A, 106B: Moving-average-value calculating circuits
114A, 114B: Moving-average-value calculating circuits
116A, 116B: Load impedance calculating circuits
120A, 120B: Load impedance calculating circuits
122A, 122B: Sampling-average-value calculating circuits
124A, 124B: Moving-average-value calculating circuits

We claim:

1. A plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a first high frequency power supply configured to output a first high frequency power having a frequency suitable for ion attraction into the substrate on the first electrode from the plasma; a first high frequency transmission line configured to transmit the first high frequency power outputted from the first high frequency power supply to the first electrode; a first matching device configured to match impedance on the side of the first high frequency power supply with load impedance, the first matching device including a variable reactance element; a second high frequency power supply configured to output a second high frequency power having a frequency suitable for plasma generation; a second high frequency transmission line configured to transmit the second high frequency power outputted from the second high frequency power supply to any one of the first electrode and the second electrode; a second matching device configured to match impedance on the side of the second high frequency power supply with load impedance on the second high frequency transmission line; and a high frequency power modulation unit configured to control the second high frequency power supply such that a first period during which the second high frequency power is on or has a first level and a second period during which the second high frequency power is off or has a second level lower than the first level is alternately repeated at a predetermined pulse frequency, the plasma processing method comprising:

a sampling-average-value calculating process of sampling voltage detection signals and electric current detection signals corresponding to the first high frequency power on the first high frequency supply line with a preset sampling frequency and calculating an average value of these signals during a first monitoring time set for both of the first period and the second period in each cycle of the pulse frequency;

a moving-average-value calculating process of calculating a moving average value of the voltage detection signals and the electric current detection signals at a cycle of a sampling clock having a frequency of 1/m times of the pulse frequency (m is an integer of 2 or more) based on an average value obtained from the sampling-average-value calculating process in each cycle;

a load impedance-measurement-value calculating process of calculating a measurement value of the load impedance with respect to the first high frequency power supply based on the moving average value of the voltage detection signals and the electric current detection signals obtained from the moving-average-value calculating process; and a reactance control process of controlling a reactance of the variable reactance element such that the measurement value of the load impedance obtained from the load impedance-measurement-value calculating process is equal or approximate to a preset matching point corresponding to impedance on the side of the first high frequency power supply.

2. A plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a first high frequency power supply configured to output a first high frequency power having a frequency suitable for ion attraction into the substrate on the first electrode from the plasma; a first high frequency transmission line configured to transmit the first high frequency power outputted from the first high frequency power supply to the first electrode; a first matching device configured to match impedance on the side of the first high frequency power supply with load impedance on the first high frequency transmission line, the first matching device including a variable reactance element; a second high frequency power supply configured to output a second high frequency power having a frequency suitable for plasma generation; a second high frequency transmission line configured to transmit the second high frequency power outputted from the second high frequency power supply to any one of the first electrode and the second electrode; a second matching device configured to match impedance on the side of the second high frequency power supply with load impedance on the second high frequency transmission line; and a high frequency power modulation unit configured to control the second high frequency power supply such that a first period during which the second high frequency power is on or has a first level and a second period during which the second high frequency power is off or has a second level lower than the first level is alternately repeated at a predetermined pulse frequency, the plasma processing method comprising:

a sampling-average-value calculating process of sampling measurement values of the load impedance on the first high frequency transmission line with a preset sampling frequency and calculating an average value of the measurement values during a first monitoring time set for both of the first period and the second period in each cycle of the pulse frequency;

a moving-average-value calculating process of calculating a moving average value of the measurement values of the load impedance at a cycle of a sampling clock having a frequency of 1/m times of the pulse frequency (m is an integer of 2 or more) based on the average value obtained from the sampling-average-value calculation process in each cycle; and a reactance control process of controlling a reactance of the variable reactance element such that the moving average value of the measurement values of the load impedance obtained from the moving-average-value calculating process is equal or approximate to a preset matching point corresponding to impedance on the side of the first high frequency power supply.

3. A plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a first high frequency power supply configured to output a first high frequency power having a frequency suitable for plasma generation; a first high frequency transmission line configured to transmit the first high frequency power outputted from the first high frequency power supply to the first electrode; a first matching device configured to match impedance on the side of the first high frequency power supply with load impedance, the first matching device including a variable reactance element; a second high frequency power supply configured to output a second high frequency power having a frequency suitable for ion attraction into the substrate on the first electrode from the plasma; a second high frequency transmission line configured to transmit the second high frequency power outputted from the second high frequency power supply to the first electrode; a second matching device configured to match impedance on the side of the second high frequency power supply with load impedance on the second high frequency transmission line; and a high frequency power modulation unit configured to control the second high frequency power supply such that a first period during which the second high frequency power is on or has a first level and a second period during which the second high frequency power is off or has a second level lower than the first level is alternately repeated at a predetermined pulse frequency, the plasma processing method comprising:

a sampling-average-value calculating process of sampling voltage detection signals and electric current detection signals corresponding to the first high frequency power on the first high frequency supply line with a preset sampling frequency and calculating an average value of these signals during a first monitoring time set for both of the first period and the second period in each cycle of the pulse frequency;

a moving-average-value calculating process of calculating a moving average value of the voltage detection signals and the electric current detection signals at a cycle of a sampling clock having a frequency of 1/m times of the pulse frequency (m is an integer of 2 or more) based on an average value obtained from the sampling-average-value calculating process in each cycle;

a load impedance-measurement-value calculating process of calculating a measurement value of the load impedance with respect to the first high frequency power supply based on the moving average value of the voltage detection signals and the electric current detection signals obtained from the moving-average-value calculating process; and a reactance control process of controlling a reactance of the variable reactance element such that the measurement value of the load impedance obtained from the load impedance-measurement-value calculating process is equal or approximate to a preset matching point corresponding to impedance on the side of the first high frequency power supply.

4. A plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a first high frequency power supply configured to output a first high frequency power having a frequency suitable for plasma generation; a first high frequency transmission line configured to transmit the first high frequency power outputted from the first high frequency power supply to the first electrode; a first matching device configured to match impedance on the side of the first high frequency power supply with load impedance, the first matching device including a variable reactance element; a second high frequency power supply configured to output a second high frequency power having a frequency suitable for ion attraction into the substrate on the first electrode from the plasma; a second high frequency transmission line configured to transmit the second high frequency power outputted from the second high frequency power supply to the first electrode; a second matching device configured to match impedance on the side of the second high frequency power supply with load impedance on the second high frequency transmission line; and a high frequency power modulation unit configured to control the second high frequency power supply such that a first period during which the second high frequency power is on or has a first level and a second period during which the second high frequency power is off or has a second level lower than the first level is alternately repeated at a predetermined pulse frequency, the plasma processing method comprising:

a sampling-average-value calculating process of sampling measurement values of the load impedance on the first high frequency transmission line with a preset sampling frequency and calculating an average value of the measurement values during a first monitoring time set for both of the first period and the second period in each cycle of the pulse frequency;

a moving-average-value calculating process of calculating a moving average value of the measurement values of the load impedance at a cycle of a sampling clock having a frequency of 1/m times of the pulse frequency (m is an integer of 2 or more) based on the average value obtained from the sampling-average-value calculation process in each cycle; and a reactance control process of controlling a reactance of the variable reactance element such that the moving average value of the measurement values of the load impedance obtained from the moving-average-value calculating process is equal or approximate to a preset matching point corresponding to impedance on the side of the first high frequency power supply.

5. The plasma processing method of claim 1, wherein the first monitoring time does not include a first transient time right after starting the first period during the first period.

6. The plasma processing method of claim 1, wherein the first monitoring time does not include a second transient time right before ending the first period during the first period.

7. A plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a high frequency power supply configured to output a high frequency power for plasma generation; a high frequency transmission line configured to transmit the high frequency power outputted from the high frequency power supply to any one of the first electrode and the second electrode; a matching device configured to match impedance on the side of the high frequency power supply with load impedance on the high frequency transmission line, the matching device including a variable reactance element; a high frequency power modulation unit configured to control the high frequency power supply such that a first period during which the high frequency power is on and a second period during which the high frequency power is off is alternately repeated at a predetermined pulse frequency, the plasma processing method comprising:
- a sampling-average-value calculating process of sampling voltage detection signals and electric current detection signals corresponding to the high frequency power on the high frequency supply line with a preset sampling frequency and calculating an average value of these signals during a monitoring time set for the first period in each cycle of the pulse frequency;
- a moving-average-value calculating process of calculating a moving average value of the voltage detection signals and the electric current detection signals at a cycle of a sampling clock having a frequency of 1/m times of the pulse frequency (m is an integer of 2 or more) based on the average value obtained from the sampling-average-value calculating process in each cycle;
- a load impedance-measurement-value calculating process of calculating a measurement value of the load impedance with respect to the high frequency power supply based on the moving average value of the voltage detection signals and the electric current detection signals obtained from the moving-average-value calculating process; and
- a reactance control process of controlling a reactance of the variable reactance element such that the measurement value of the load impedance obtained from the load impedance-measurement-value calculating process is equal or approximate to a preset matching point corresponding to impedance on the side of the high frequency power supply.

8. A plasma processing method for performing a plasma process on a substrate in a plasma processing apparatus comprising: an evacuable processing vessel that accommodates therein a first electrode that mounts thereon the substrate and a second electrode that faces the first electrode, plasma being generated by high frequency discharge of a processing gas between the first electrode and the second electrode within the evacuable processing vessel; a high frequency power supply configured to output a high frequency power for plasma generation; a high frequency transmission line configured to transmit the high frequency power outputted from the high frequency power supply to any one of the first electrode and the second electrode; a matching device configured to match impedance on the side of the high frequency power supply with load impedance on the high frequency transmission line, the matching device including a variable reactance element; a high frequency power modulation unit configured to control the high frequency power supply such that a first period during which the high frequency power is on and a second period during which the high frequency power is off is alternately repeated at a predetermined pulse frequency, the plasma processing method comprising:
- a sampling-average-value calculating process of sampling measurement values of the load impedance on the high frequency transmission line with a preset sampling frequency and calculating an average value of the measurement values during a monitoring time set for the first period in each cycle of the pulse frequency;
- a moving-average-value calculating process of calculating a moving average value of the measurement values of the load impedance at a cycle of a sampling clock having a frequency of 1/m times of the pulse frequency (m is an integer of 2 or more) based on the average value obtained from the sampling-average-value calculation process in each cycle; and
- a reactance control process of controlling a reactance of the variable reactance element such that the moving average value of the measurement values of the load impedance obtained from the moving-average-value calculating process is equal or approximate to a preset matching point corresponding to impedance on the side of the high frequency power supply.

9. The plasma processing method of claim 7, wherein the monitoring time does not include a first transient time right after starting the first period during the first period.

10. The plasma processing method of claim 7, wherein the monitoring time does not include a second transient time right before ending the first period during the first period.

11. The plasma processing method of claim 7, wherein the monitoring time is not set within the second period.

12. The plasma processing method of claim 1, wherein the high frequency power modulation unit is configured to vary at least one of the pulse frequency or a ratio, which is a duty ratio, of the first period in each cycle of the pulse frequency with respect to an entire time in each cycle thereof.

* * * * *